(12) United States Patent
Shin et al.

(10) Patent No.: US 9,882,139 B2
(45) Date of Patent: Jan. 30, 2018

(54) HETEROCYCLIC COMPOUND AND ORGANIC LIGHT-EMITTING DIODE INCLUDING THE SAME

(71) Applicant: SAMSUNG DISPLAY CO., LTD., Yongin, Gyeonggi-Do (KR)

(72) Inventors: Dong-Woo Shin, Yongin (KR); Seul-Ong Kim, Yongin (KR); O-Hyun Kwon, Yongin (KR); Kyul Han, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 684 days.

(21) Appl. No.: 14/270,490

(22) Filed: May 6, 2014

(65) Prior Publication Data

US 2015/0048324 A1  Feb. 19, 2015

(30) Foreign Application Priority Data

Aug. 14, 2013  (KR) .................. 10-2013-0096896

(51) Int. Cl.
*H01L 51/50* (2006.01)
*H01L 51/00* (2006.01)
*C09K 11/06* (2006.01)

(52) U.S. Cl.
CPC .......... *H01L 51/0054* (2013.01); *C09K 11/06* (2013.01); *H01L 51/0055* (2013.01); *H01L 51/0072* (2013.01); *H01L 51/0081* (2013.01); *H01L 51/5016* (2013.01)

(58) Field of Classification Search
None
See application file for complete search history.

(56) References Cited

U.S. PATENT DOCUMENTS

| | | | |
|---|---|---|---|
| 5,153,073 A | 10/1992 | Ohnuma et al. | |
| 5,155,566 A * | 10/1992 | Nakayama | B05D 1/202 257/103 |
| 6,313,349 B1 | 11/2001 | Sato | |
| 6,396,209 B1 * | 5/2002 | Kido | H01L 51/5052 313/503 |
| 7,097,917 B1 * | 8/2006 | Fujita | C07C 13/62 252/301.16 |
| 2003/0118866 A1 * | 6/2003 | Oh | H01L 51/006 428/690 |
| 2004/0076853 A1 * | 4/2004 | Jarikov | C09K 11/06 428/690 |
| 2004/0124766 A1 * | 7/2004 | Nakagawa | H01L 51/0064 313/504 |
| 2005/0222417 A1 * | 10/2005 | Brown | C07C 2/82 546/37 |
| 2006/0086938 A1 * | 4/2006 | Kang | G02F 1/1345 257/72 |
| 2006/0134464 A1 * | 6/2006 | Nariyuki | C09K 11/06 428/690 |
| 2007/0138953 A1 * | 6/2007 | Tobise | H01L 51/5048 313/506 |
| 2008/0213624 A1 * | 9/2008 | Lecloux | C09K 11/06 428/691 |

FOREIGN PATENT DOCUMENTS

| | | |
|---|---|---|
| JP | 2002-235075 A * | 8/2002 |
| KR | 10-2011-0008619 A | 1/2011 |
| KR | 10-2011-0087214 A | 8/2011 |
| WO | WO 2011/010839 A1 | 1/2011 |

OTHER PUBLICATIONS

Machine translation for JP 2002-235075 A (Publication date: Aug. 2002).*

* cited by examiner

*Primary Examiner* — Dawn Garrett
(74) *Attorney, Agent, or Firm* — Lee & Morse, P.C.

(57) ABSTRACT

A heterocyclic compound represented by Formula 1 and an organic light-emitting diode including the same:

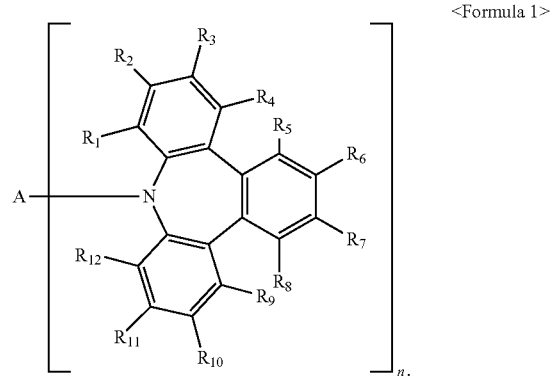

<Formula 1>

17 Claims, 1 Drawing Sheet

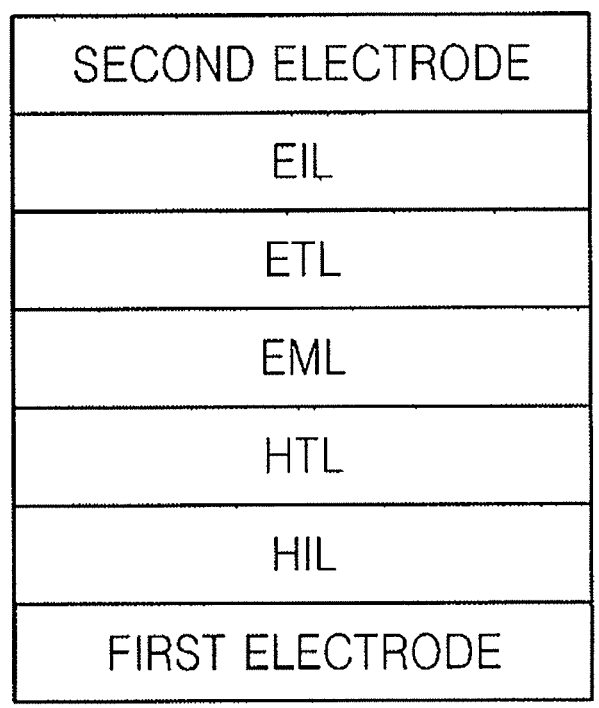

HETEROCYCLIC COMPOUND AND ORGANIC LIGHT-EMITTING DIODE INCLUDING THE SAME

CROSS-REFERENCE TO RELATED APPLICATION

Korean Patent Application No. 10-2013-0096896, filed on Aug. 14, 2013, in the Korean Intellectual Property Office, and entitled: "Heterocyclic Compound and Organic Light-Emitting Diode Including The Same," is incorporated by reference herein in its entirety.

BACKGROUND

1. Field

One or more embodiments relate to a heterocyclic compound and an organic light-emitting diode including the same.

2. Description of the Related Art

Organic light-emitting diodes (OLEDs), which are self-emitting diodes, may have wide viewing angle, excellent contrast, quick response, high brightness, excellent driving voltage characteristics, and can provide multicolored images.

SUMMARY

Embodiments may be realized by providing a heterocyclic compound represented by Formula 1:

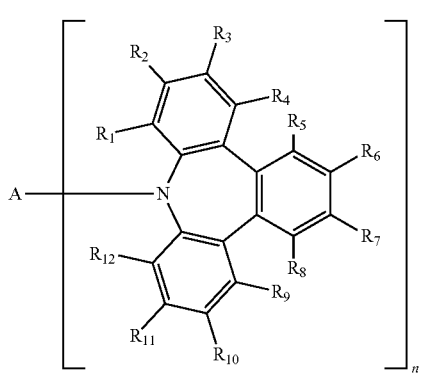

<Formula 1> wherein:

$R_1$ to $R_{12}$ are each independently a hydrogen atom, a deuterium atom, a halogen group, a nitro group, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{60}$ cycloalkyl group, a substituted or unsubstituted $C_3$-$C_{60}$ cycloalkenyl group, a substituted or unsubstituted $C_5$-$C_{60}$ cycloalkynyl group, a substituted or unsubstituted $C_6$-$C_{60}$ aryl group, a substituted or unsubstituted $C_2$-$C_{60}$ heteroaryl group, a substituted or unsubstituted $C_6$-$C_{60}$ arylamino group, or —$SiR_{51}R_{52}R_{53}$;

$R_{51}$ to $R_{53}$ are each independently a hydrogen atom, a deuterium atom, a substituted or unsubstituted $C_1$-$C_{60}$ alkyl group, or a substituted or unsubstituted $C_6$-$C_{60}$ aryl group;

A is a substituted or unsubstituted $C_6$-$C_{60}$ arylene group, a substituted or unsubstituted $C_6$-$C_{60}$ condensed polycyclic group, or a divalent linking group in which at least two of the arylene group and the condensed polycyclic group are connected; and n is an integer of 1 to 3.

According to one or more embodiments, an organic light-emitting diode includes a first electrode; a second electrode facing the first electrode; and an organic layer disposed between the first electrode and the second electrode, the organic layer including the above-described heterocyclic compound.

According to one or more embodiments, an organic light-emitting diode includes a first electrode that is electrically connected to a source electrode or a drain electrode of a thin film transistor (TFT).

BRIEF DESCRIPTION OF THE DRAWING

Features will become apparent to those of skill in the art by describing in detail exemplary embodiments with reference to the attached drawings in which:

The FIGURE illustrates a schematic view of a structure of an organic light-emitting diode (OLED) according to an embodiment.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. As used herein, the term "and/or" includes any and all combinations of one or more of the associated listed items. Expressions such as "at least one of," when preceding a list of elements, modify the entire list of elements and do not modify the individual elements of the list.

According to an embodiment, there is provided an organic light-emitting diode (OLED) including a compound represented by Formula 1 below:

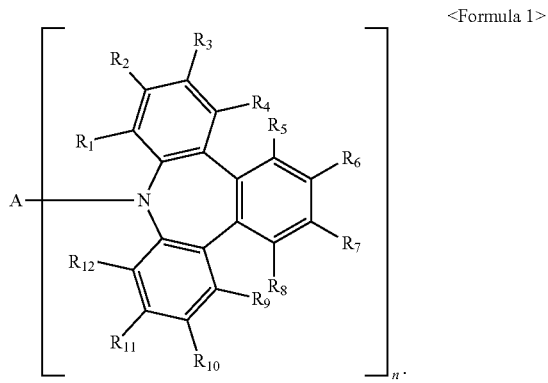

<Formula 1>

In Formula 1 above, $R_1$ to $R_{12}$ may each independently be a hydrogen atom, a deuterium atom, a halogen group, a nitro group, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{60}$ cycloalkyl group, a substituted or unsubstituted $C_3$-$C_{60}$ cycloalkenyl group, a substituted or unsubstituted $C_5$-$C_{60}$ cycloalkynyl group, a substituted or unsubstituted $C_6$-$C_{60}$ aryl group, a substituted or unsubstituted $C_2$-$C_{60}$ heteroaryl group, or a substituted or unsubstituted $C_6$-$C_{60}$ arylamino group;

A may be a substituted or unsubstituted $C_6$-$C_{60}$ arylene group, a substituted or unsubstituted $C_6$-$C_{60}$ condensed polycyclic group, or a divalent linking group in which at least two of the arylene group and the condensed polycyclic group are connected; and n is an integer of 1 to 3.

Substituents of the compound represented by Formula 1 used herein will now be described in detail.

According to an embodiment, A in Formula 1 may be represented by one of Formulae 2a to 2j below:

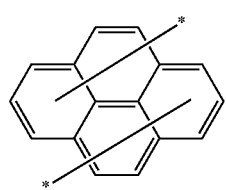

2a

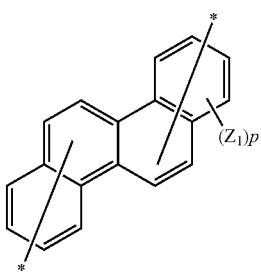

2b

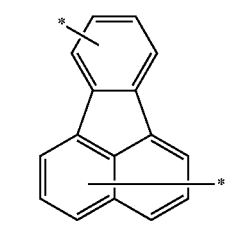

2c

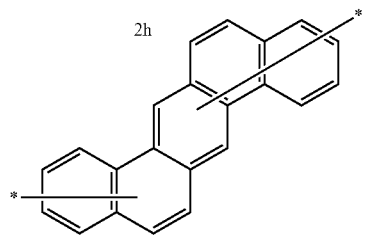

2d

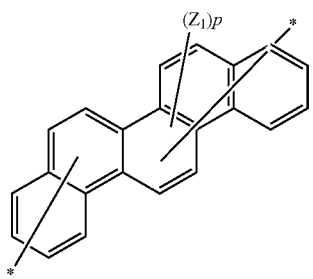

2e

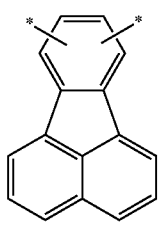

2f

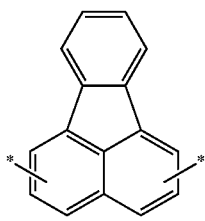

2g

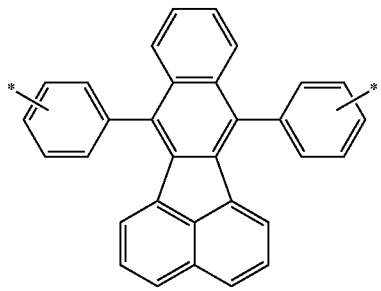

2h

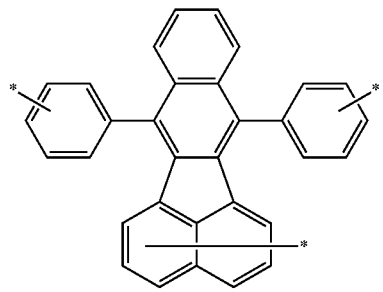

2i

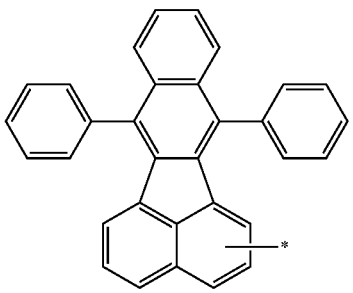

2j

In Formulae 2a to 2j above, $Z_1$ may be a hydrogen atom, a deuterium atom, a substituted or unsubstituted $C_1$-$C_{20}$ alkyl group, a substituted or unsubstituted $C_6$-$C_{20}$ aryl group, a substituted or unsubstituted $C_2$-$C_{20}$ heteroaryl group, a substituted or unsubstituted $C_6$-$C_{20}$ condensed polycyclic group, a halogen group, a cyano group, a nitro group, a hydroxyl group, or a carboxyl group, wherein $Z_1$ may be identical to or different from each other when there is a plurality of $Z_1$s; p is an integer of 1 to 4; and * indicates a binding site to N of an azepine moiety.

According to another embodiment, the compound of Formula 1 may be represented by Formula 2 below:

In Formula 3 above, $R_1$ to $R_{12}$ may be as defined above; $R_{21}$ to $R_{32}$ may each independently indicate a binding site to N, a hydrogen atom, a deuterium atom, a substituted or unsubstituted $C_1$-$C_{60}$ alkyl group, a substituted or unsubstituted $C_6$-$C_{60}$ aryl group, a substituted or unsubstituted $C_2$-$C_{60}$ heteroaryl group, or —$SiR_{51}R_{52}R_{53}$; $R_{51}$ to $R_{53}$ may each independently be a hydrogen atom, a deuterium atom, a substituted or unsubstituted $C_1$-$C_{60}$ alkyl group, or a substituted or unsubstituted $C_6$-$C_{60}$ aryl group; and n is an integer of 1 to 3. Thus, any one, and up to 3, of $R_{21}$ to $R_{32}$ may be a binding site to N of an azepine moiety.

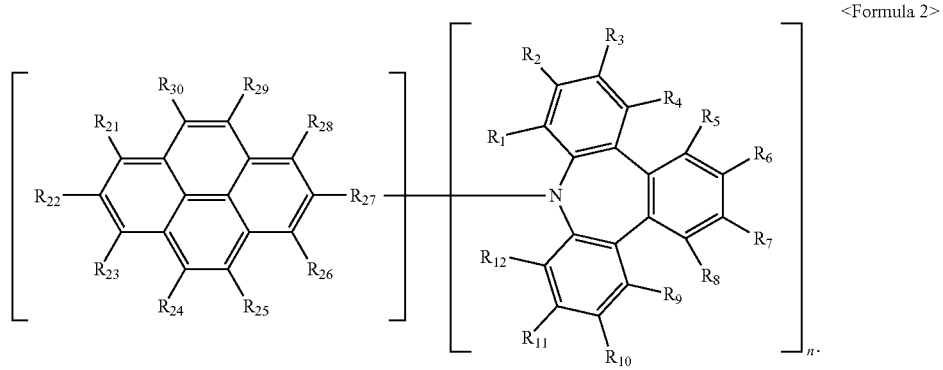

<Formula 2>

In Formula 2 above, $R_1$ to $R_{12}$ may be as defined above; $R_{21}$ to $R_{30}$ may each independently be a binding site to N, a hydrogen atom, a deuterium atom, or a substituted or unsubstituted $C_1$-$C_{60}$ alkyl group, a substituted or unsubstituted $C_6$-$C_{60}$ aryl group, a substituted or unsubstituted $C_2$-$C_{60}$ heteroaryl group, or —$SiR_{51}R_{52}R_{53}$; $R_{51}$ to $R_{53}$ may each independently be a hydrogen atom, a deuterium atom, a substituted or unsubstituted $C_1$-$C_{60}$ alkyl group, or a substituted or unsubstituted $C_6$-$C_{60}$ aryl group; and n is an integer of 1 to 3. Thus, any one, and up to 3, of $R_{21}$ to $R_{30}$ may be a binding site to N of an azepine moiety.

When any one of $R_{21}$ to $R_{30}$ is a binding site to N, a pyrene moiety may bond to an azepine moiety at the binding site (hereinafter, a binding site is as described above).

According to another embodiment, the compound of Formula 1 may be represented by Formula 3 below:

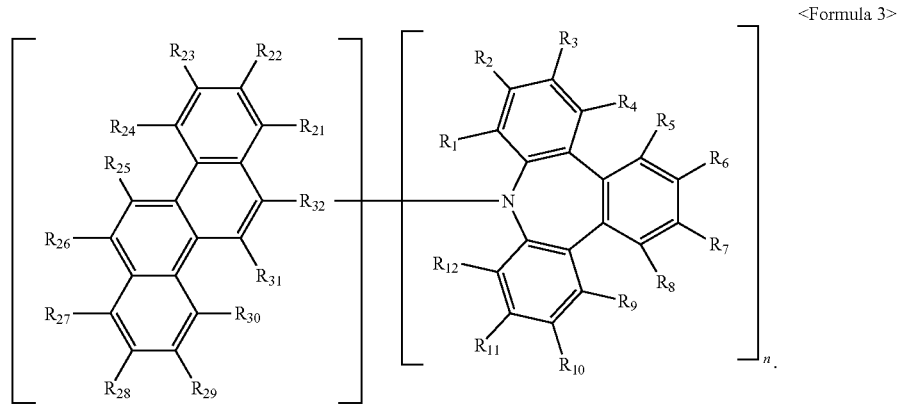

<Formula 3>

According to another embodiment, the compound of Formula 1 may be represented by Formula 4 below:

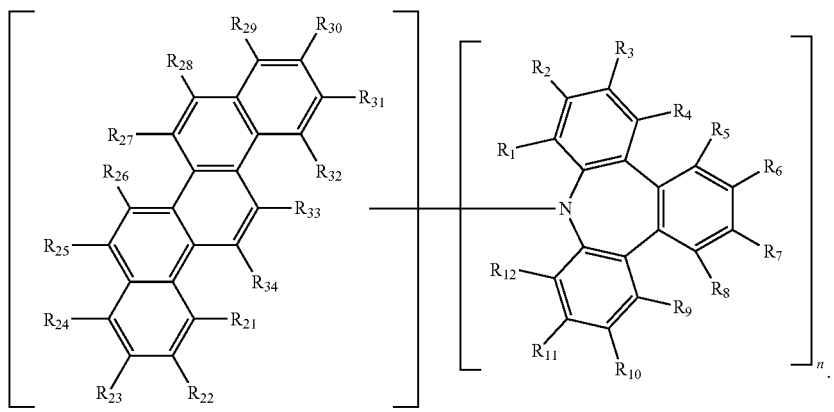

<Formula 4>

In Formula 4 above, $R_1$ to $R_{12}$ may be as defined above; $R_{21}$ to $R_{34}$ may each independently be a binding site to N, a hydrogen atom, a deuterium atom, a substituted or unsubstituted $C_1$-$C_{60}$ alkyl group, a substituted or unsubstituted $C_6$-$C_{60}$ aryl group, a substituted or unsubstituted $C_2$-$C_{60}$ heteroaryl group, or —$SiR_{51}R_{52}R_{53}$; $R_{51}$ to $R_{53}$ may each independently be a hydrogen atom, a deuterium atom, a substituted or unsubstituted $C_1$-$C_{60}$ alkyl group, or a substituted or unsubstituted $C_6$-$C_{60}$ aryl group; and n is an integer of 1 to 3. Thus, any one, and up to 3, of $R_{21}$ to $R_{34}$ may be a binding site to N of an azepine moiety.

According to another embodiment, the compound of Formula 1 may be represented by Formula 5 below:

In Formula 5 above, $R_1$ to $R_{12}$ may be as defined above; $R_{21}$ to $R_{34}$ may each independently be a binding site to N, a hydrogen atom, a deuterium atom, a substituted or unsubstituted $C_1$-$C_{60}$ alkyl group, a substituted or unsubstituted $C_6$-$C_{60}$ aryl group, a substituted or unsubstituted $C_2$-$C_{60}$ heteroaryl group, or —$SiR_{51}R_{52}R_{53}$; $R_{51}$ to $R_{53}$ may each independently be a hydrogen atom, a deuterium atom, a substituted or unsubstituted $C_1$-$C_{60}$ alkyl group, or a substituted or unsubstituted $C_6$-$C_{60}$ aryl group; and n is an integer of 1 to 3. Thus, any one, and up to 3, of $R_{21}$ to $R_{34}$ may be a binding site to N of an azepine moiety.

According to another embodiment, the compound of Formula 1 may be represented by Formula 6 below:

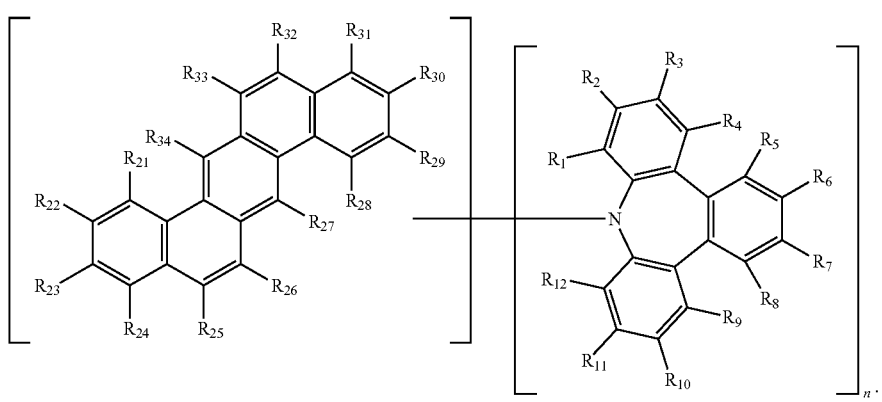

<Formula 5>

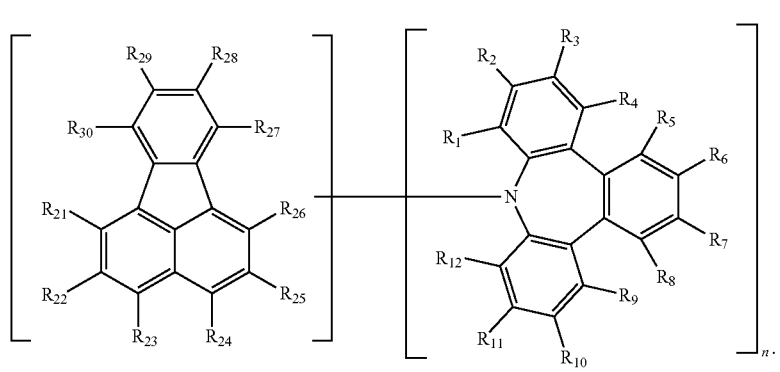

<Formula 6>

In Formula 6 above, $R_1$ to $R_{12}$ may be as defined above; $R_{21}$ to $R_{30}$ may each independently be a binding site to N, a hydrogen atom, a deuterium atom, a substituted or unsubstituted $C_1$-$C_{60}$ alkyl group, a substituted or unsubstituted $C_6$-$C_{60}$ aryl group, a substituted or unsubstituted $C_2$-$C_{60}$ heteroaryl group, or —$SiR_{51}R_{52}R_{53}$; $R_{51}$ to $R_{53}$ may each independently be a hydrogen atom, a deuterium atom, a substituted or unsubstituted $C_1$-$C_{60}$ alkyl group, or a substituted or unsubstituted $C_6$-$C_{60}$ aryl group; and n is an integer of 1 to 3. Thus, any one, and up to 3, of $R_{21}$ to $R_{30}$ may be a binding site to N of an azepine moiety.

According to another embodiment, the compound of Formula 1 may be represented by Formula 7 below:

tuted $C_1$-$C_{60}$ alkyl group are a methyl group, an ethyl group, a propyl group, an iso-butyl group, a sec-butyl group, a pentyl group, an iso-amyl group, a hexyl group, a heptyl group, an octyl group, a nonanyl group, and a dodecyl group. At least one hydrogen atom of the unsubstituted $C_1$-$C_{60}$ alkyl group may be substituted with a deuterium atom, a halogen group, a hydroxyl group, a nitro group, a cyano group, an amino group, an aminido group, a hydrazine, a hydrazone, a carboxyl group or a salt thereof, a sulfonic acid group or a salt thereof, a phosphoric acid group or a salt thereof, a $C_1$-$C_{10}$ alkyl group, a $C_1$-$C_{10}$ alkoxy group, a $C_2$-$C_{10}$ alkenyl group, a $C_2$-$C_{10}$ alkynyl group, a $C_6$-$C_{16}$ aryl group, or a $C_2$-$C_{16}$ heteroaryl group.

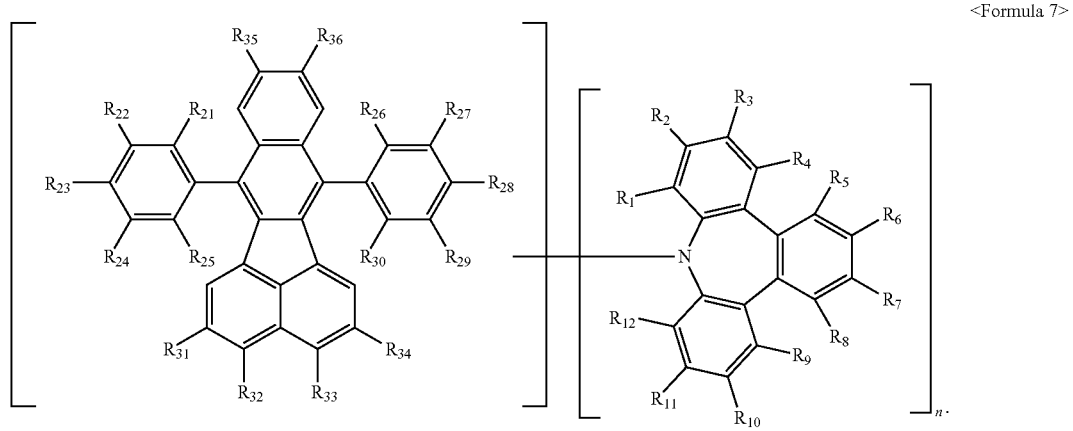

<Formula 7>

In Formula 7 above, $R_1$ to $R_{12}$ may be as defined above; $R_{21}$ to $R_{36}$ may each independently be a binding site to N, a hydrogen atom, a deuterium atom, a substituted or unsubstituted $C_1$-$C_{60}$ alkyl group, a substituted or unsubstituted $C_6$-$C_{60}$ aryl group, a substituted or unsubstituted $C_2$-$C_{60}$ heteroaryl group, or —$SiR_{51}R_{52}R_{53}$; $R_{51}$ to $R_{53}$ may each independently be a hydrogen atom, a deuterium atom, a substituted or unsubstituted $C_1$-$C_{60}$ alkyl group, or a substituted or unsubstituted $C_6$-$C_{60}$ aryl group; and n is an integer of 1 to 3. Thus, any one, and up to 3, of $R_{21}$ to $R_{36}$ may be a binding site to N of an azepine moiety.

Hereinafter, definition of representative substituents used herein will now be described in detail (In this regard, numbers of carbons limiting a substituent are non-limited, and thus the substituent characteristics are not limited).

The unsubstituted $C_1$-$C_{60}$ alkyl group used herein may be linear or branched. Non-limiting examples of the unsubsti- The unsubstituted $C_2$-$C_{60}$ alkenyl group indicates an unsubstituted alkyl group having at least one carbon-carbon double bond in the center or at a terminal thereof. Examples of the unsubstituted $C_2$-$C_{60}$ alkenyl are an ethenyl group, a propenyl group, and a butenyl group. At least one hydrogen atom of the unsubstituted $C_2$-$C_{60}$ alkenyl group may be substituted with the same substituent as used in the substituted alkyl group described above.

The unsubstituted $C_2$-$C_{60}$ alkynyl group indicates an unsubstituted alkyl group having at least one carbon-carbon triple bond in the center or at a terminal of thereof. Examples of the unsubstituted $C_2$-$C_{60}$ alkynyl group are acetylene, propylene, phenylacetylene, naphthylacetylene, isopropylacetylene, t-butylacetylene, and diphenylacetylene. At least one hydrogen atom of the unsubstituted $C_2$-$C_{60}$ alkynyl group may be substituted with the same substituent as used in the substituted alkyl group described above.

The unsubstituted $C_3$-$C_{60}$ cycloalkyl group indicates an alkyl group in the form of $C_3$-$C_{60}$ rings, and at least one hydrogen atom of the unsubstituted $C_3$-$C_{60}$ cycloalkyl group may be substituted with the same substituent as used in the $C_1$-$C_{60}$ alkyl group described above.

The unsubstituted $C_1$-$C_{60}$ alkoxy group has a structure of —OA (wherein, A is an unsubstituted $C_1$-$C_{60}$ alkyl group as described above). Non-limiting examples of the unsubstituted $C_1$-$C_{60}$ alkoxy group are a methoxy group, an ethoxy group, a propoxy group, an isopropyloxy group, a butoxy group, and a pentoxy group. At least one hydrogen atom of the unsubstituted $C_1$-$C_{60}$ alkoxy group may be substituted with the same substituent as used in the substituted alkyl group described above.

The unsubstituted $C_6$-$C_{60}$ aryl group indicates a carbocyclic aromatic system including at least one ring. When the unsubstituted $C_6$-$C_{60}$ aryl group has two or more of rings, the rings may be fused or linked to each other by a single bond. The term 'aryl' refers to an aromatic system, such as phenyl, napthyl, and anthracenyl. Also, at least one hydrogen atom of the unsubstituted $C_6$-$C_{60}$ aryl group may be substituted with the same substituent as used in the $C_1$-$C_{60}$ alkyl group described above.

Examples of the substituted or unsubstituted $C_6$-$C_{60}$ aryl group are a phenyl group, a $C_1$-$C_{10}$ alkylphenyl group (e.g., an ethylphenyl group), a biphenyl group, a $C_1$-$C_{10}$ alkylbiphenyl group, a $C_1$-$C_{10}$ alkoxybiphenyl group, an o-, m-, and p-toryl group, an o-, m-, and p-cumenyl group, a mesityl group, a phenoxyphenyl group, an ($\alpha,\alpha$-dimethylbenzene) phenyl group, an (N,N'-dimethyl)aminophenyl group, an (N,N'-diphenyl)aminophenyl group, a pentalenyl group, an indenyl group, a naphtyl group, a $C_1$-$C_{10}$ alkylnaphtyl group (e.g., a methylnaphtyl group), a $C_1$-$C_{10}$ alkoxynaphtyl group (e.g., a methoxynaphtyl group), an anthracenyl group, an azulenyl group, a heptalenyl group, an acenaphtylenyl group, a phenalenyl group, a fluorenyl group, an anthraquinolyl group, a methylanthryl group, a phenanthryl group, a triphenylene group, a pyrenyl group, a chrycenyl group, an ethyl-chrysenyl group, a picenyl group, a perylenyl group, a pentaphenyl group, a pentacenyl group, a tetraphenylenyl group, a hexaphenyl group, a hexacenyl group, a rubicenyl group, a coroneryl group, a trinaphtylenyl group, a heptaphenyl group, a heptacenyl group, a pyranthrenyl group, and an ovalenyl group.

The unsubstituted $C_2$-$C_{60}$ heteroaryl group used herein may include one, two, three, or four hetero atoms selected from N, O, P, or S. When the unsubstituted $C_2$-$C_{60}$ heteroaryl group has two or more of rings, the rings may be fused or linked to each other by a single bond. Examples of the unsubstituted $C_2$-$C_{60}$ heteroaryl group are a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazol group, an indolyl group, a quinolinyl group, an isoquinolinyl group, and a dibenzothiophene group. In addition, at least one hydrogen atom of the unsubstituted $C_2$-$C_{60}$ heteroaryl group may be substituted with the same substituent as used in the unsubstituted $C_1$-$C_{60}$ alkyl group described above.

The unsubstituted $C_6$-$C_{60}$ aryloxy group is a group represented by —$OA_1$, wherein $A_1$ is a $C_6$-$C_{60}$ aryl group. An example of the unsubstituted $C_6$-$C_{60}$ aryloxy group is a phenoxy group. At least one hydrogen atom of the unsubstituted $C_6$-$C_{60}$ aryloxy group may be substituted with the same substituent as used in the unsubstituted $C_1$-$C_{60}$ alkyl group described above.

The unsubstituted $C_6$-$C_{60}$ arylthio group is a group represented by —$SA_1$, wherein $A_1$ is a $C_6$-$C_{60}$ aryl group. Examples of the unsubstituted $C_6$-$C_{60}$ arylthio group are a benzenethio group and a naphthylthio group. At least one hydrogen atom of the unsubstituted $C_6$-$C_{60}$ arylthio group may be substituted with the same substituent as used in the unsubstituted $C_1$-$C_{60}$ alkyl group described above.

The unsubstituted $C_6$-$C_{60}$ condensed polycyclic group used herein refers to a substituent including at least two rings, wherein at least one aromatic ring and/or at least one non-aromatic ring are fused to each other, or refers to a substituent having an unsaturated group in a ring that may not form a conjugated structure. Thus, the unsubstituted $C_6$-$C_{60}$ condensed polycyclic group is distinct from an aryl group or a heteroaryl group in terms of being non-aromatic.

According to another embodiment, examples of the compound represented by Formula 1 include compounds 1 to 32 below:

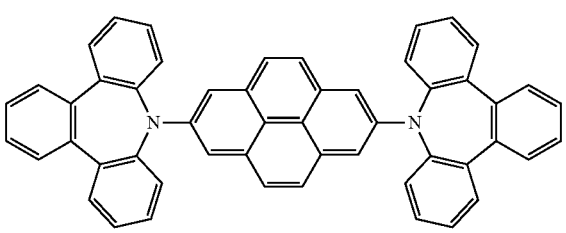

1

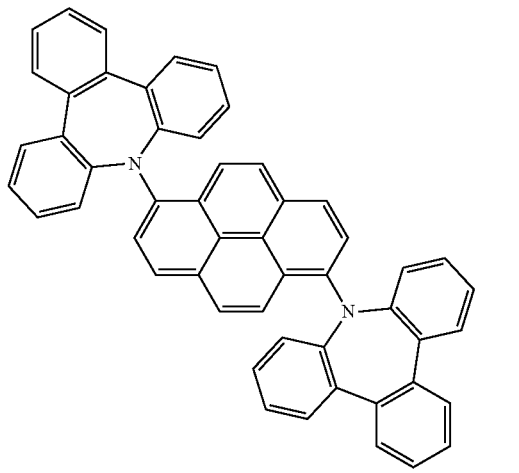

2

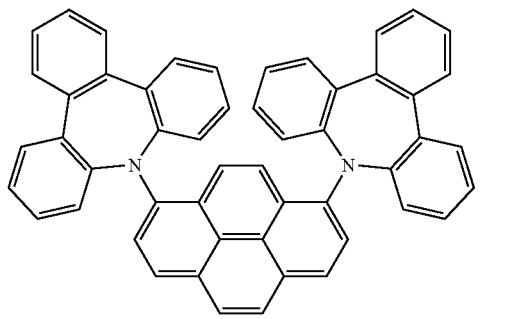

3

4
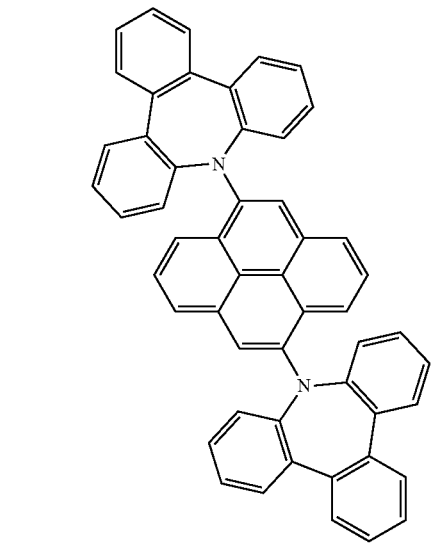
5
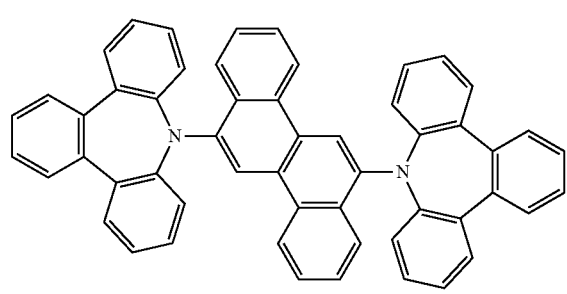
6
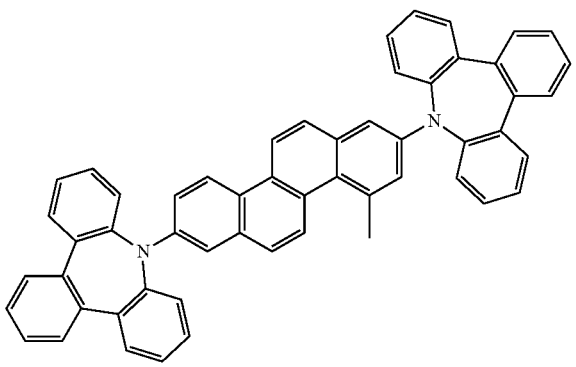
7
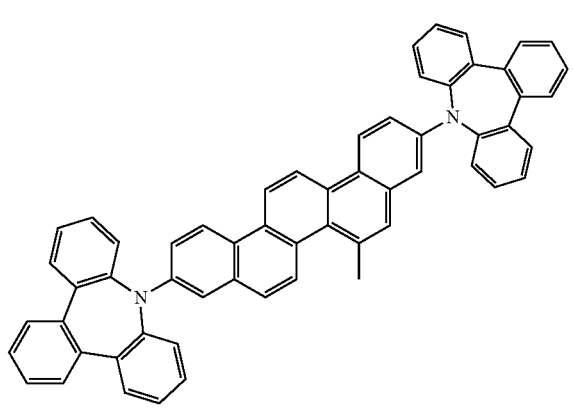
8
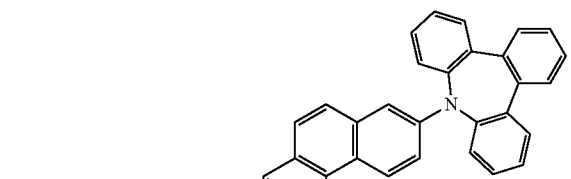
9
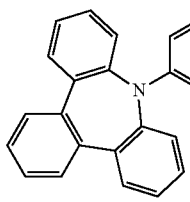
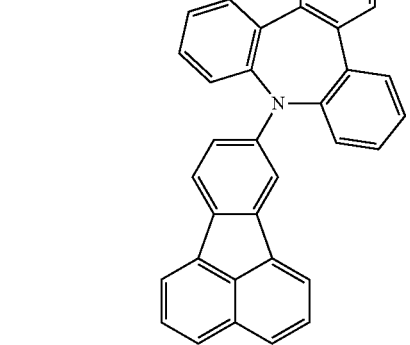
10
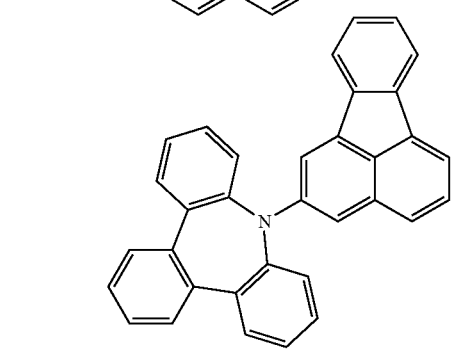
11
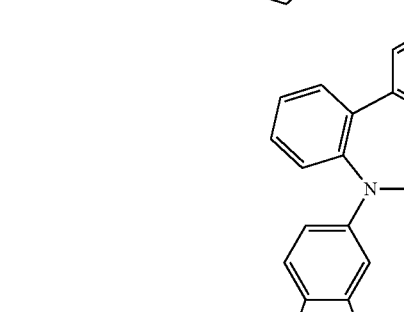
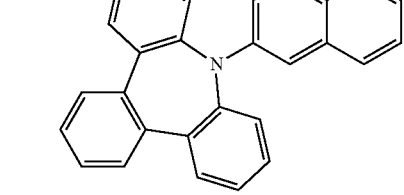

-continued
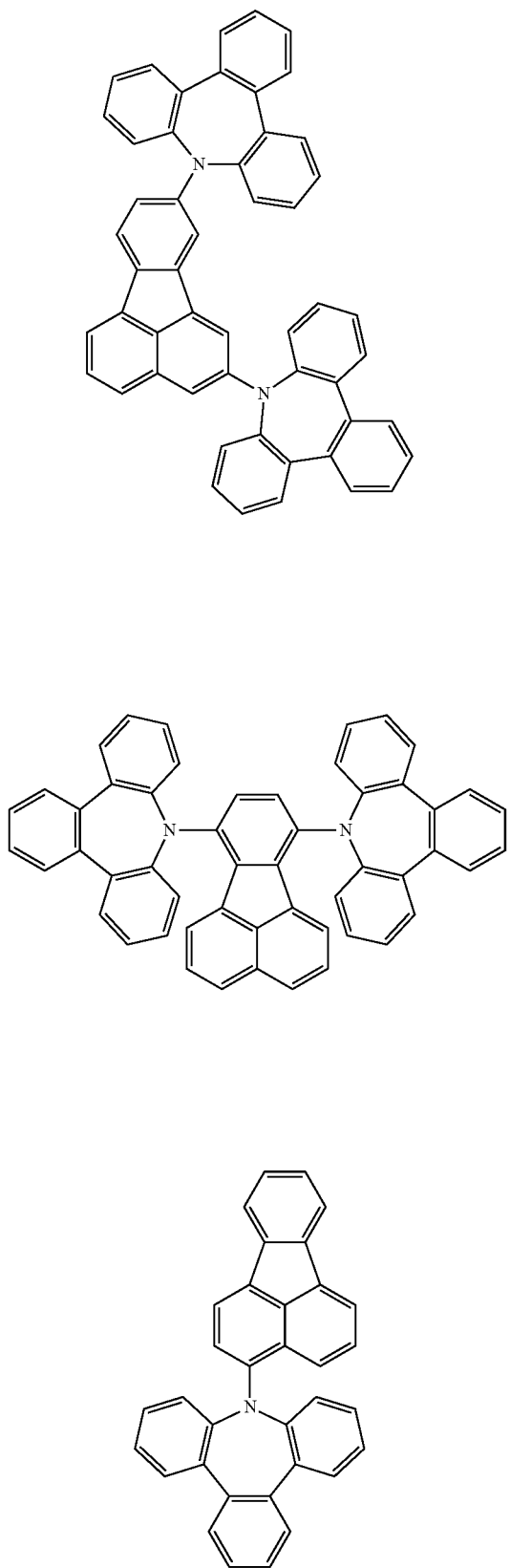
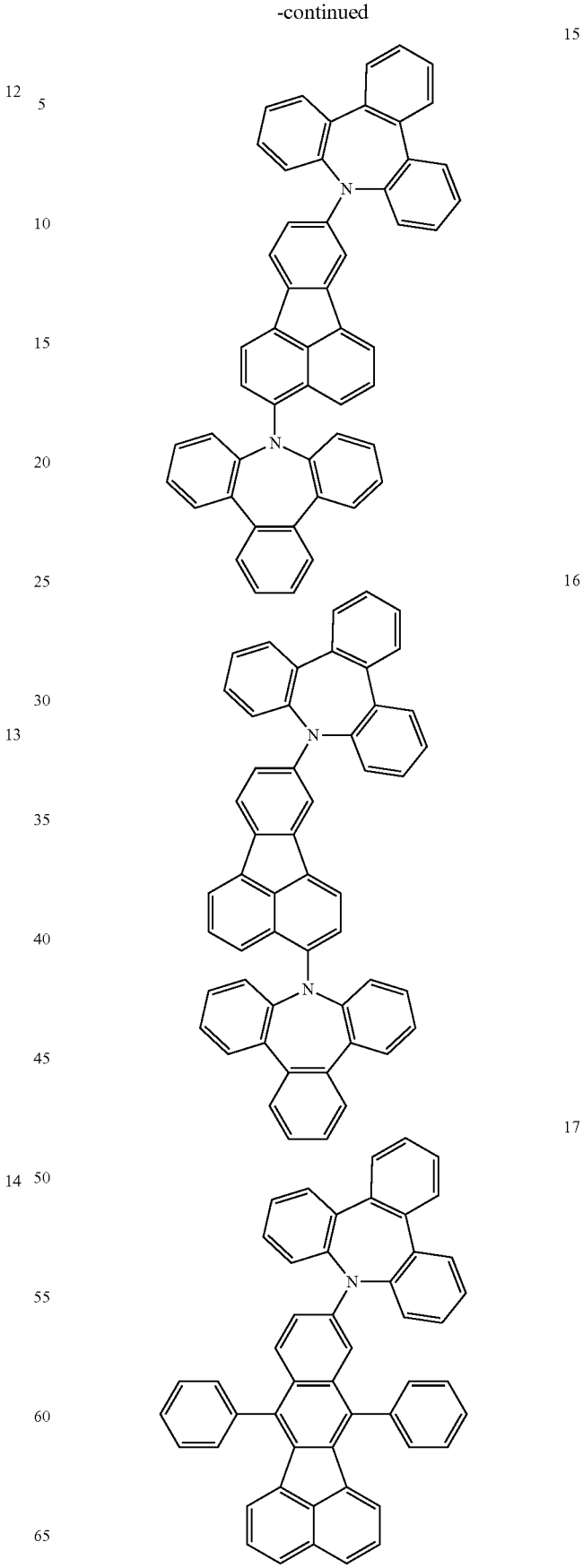

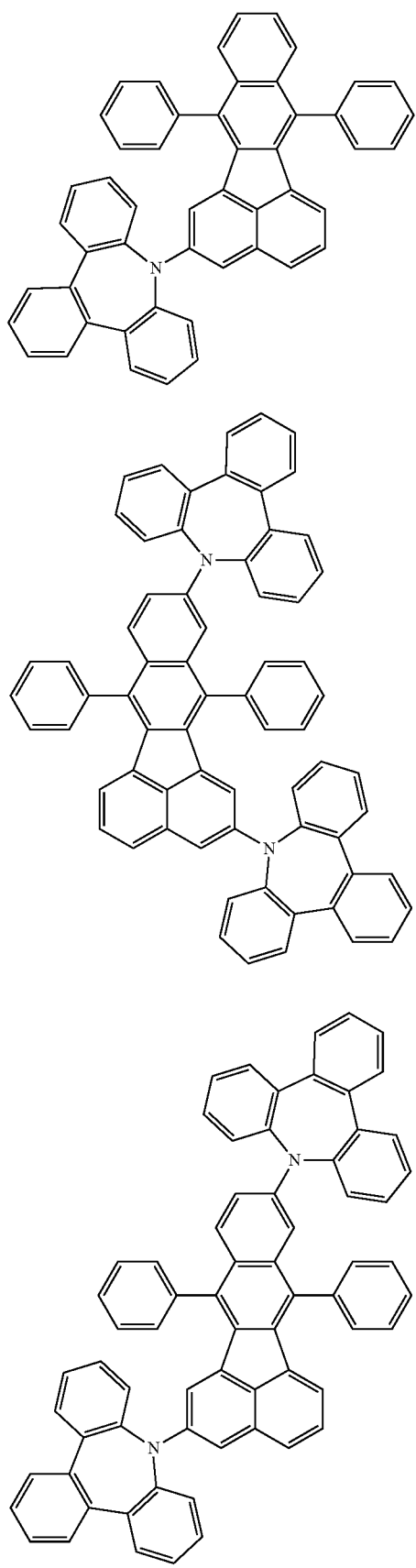
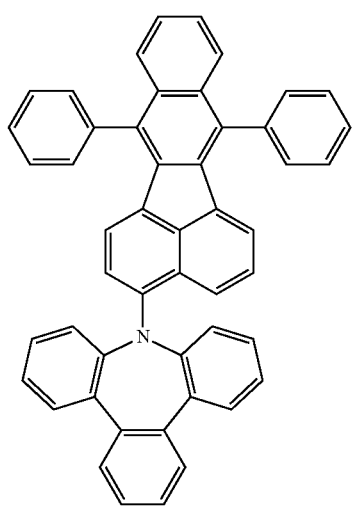
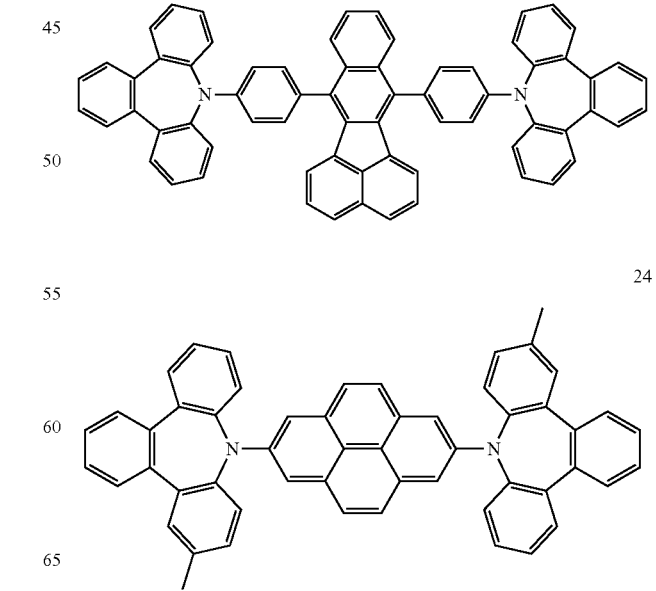

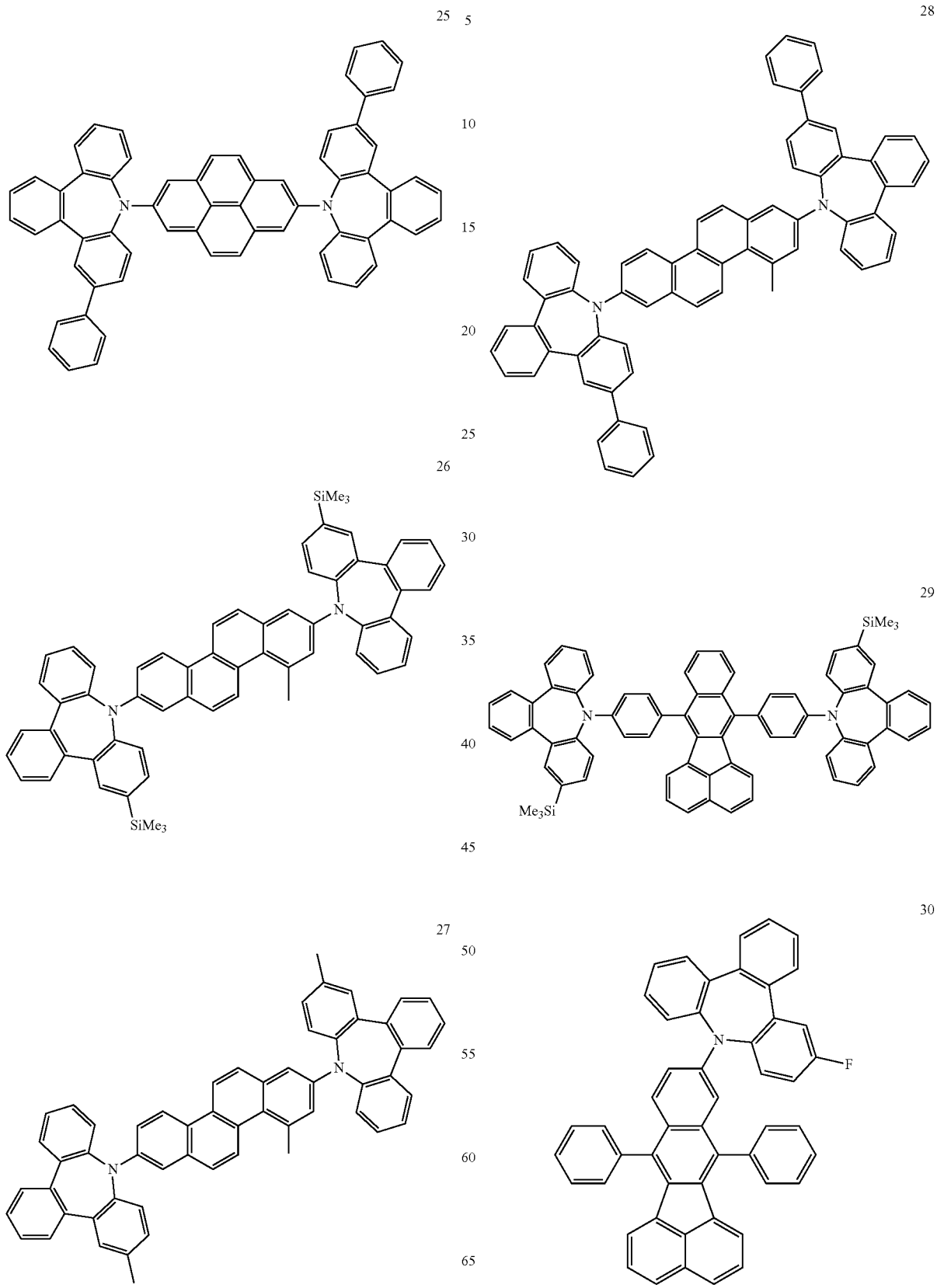

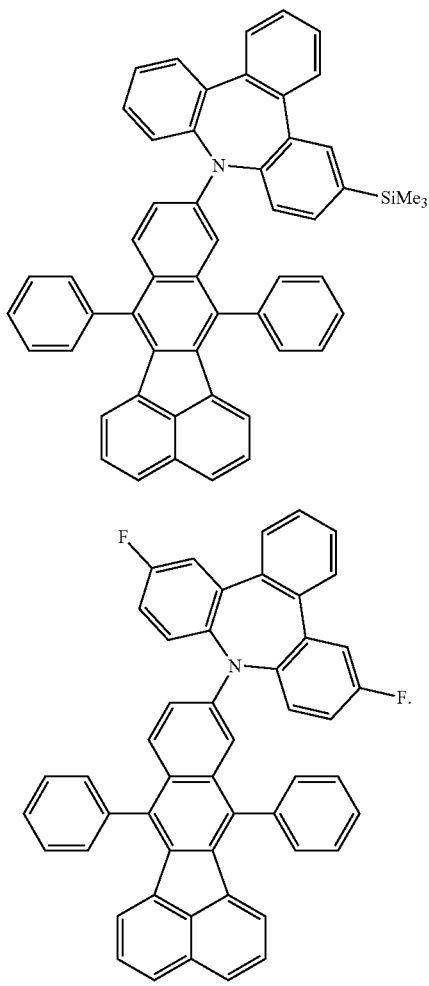

According to another embodiment, an organic-light emitting diode (OLED) includes a first electrode; a second electrode; and an organic layer that is disposed between the first electrode and the second electrode, the organic layer including at least one of the heterocyclic compounds of Formula 1.

The organic layer may include at least one layer selected from a hole injection layer (HIL), a hole transport layer (HTL), a functional layer having both hole injection and hole transport capabilities (hereinafter, referred to as a "H-functional layer"), a buffer layer, an electron blocking layer (EBL), an emission layer (EML), a hole blocking layer (HBL), an electron transport layer (ETL), an electron injection layer (EIL), and a functional layer having both electron injection and electron transport capabilities (hereinafter, referred to as an "E-functional layer").

In greater detail, the organic layer may be an EML, for example a blue EML.

According to another embodiment, the organic layer may include an EIL, an ETL, an E-functional layer having both electron injection and electron transport capabilities, an EML, an HIL, an HTL, or an H-functional layer having both hole injection and hole transport capabilities, wherein the EML may further include an anthracene-based compound, an arylamine-based compound, or a styryl-based compound.

According to another embodiment, the organic layer may include an EIL, an ETL, an E-functional layer having both electron injection and electron transport capabilities, an EML, an HIL, an HTL, or an H-functional layer having both hole injection and hole transport capabilities, wherein at least one layer of a red EML, a green EML, a blue EML, and a white EML of the EML may include a phosphorescent compound. The HIL, the HTL, or the H-functional layer having both hole injection and hole transport capabilities may include a charge-generating material. The charge-generating material may be a p-dopant, and the p-dopant may be a quinone derivative, a metal oxide, or a cyano group-containing compound.

According to another embodiment, the organic layer may include an ETL, and the ETL may include an electron-transporting organic compound and a metal complex. Here, the metal complex may be a lithium (Li) complex.

The term "organic layer" used herein refers to a single layer and/or a multi-layer disposed between the first electrode and the second electrode of the OLED.

The FIGURE illustrates a schematic view of a structure of the OLED according to an embodiment. Hereinafter, a structure and a manufacturing method of the OLED according to an embodiment will be described in detail with reference to the FIGURE.

A substrate (not illustrated) may be any substrate that can be used in an OLED. For example, the substrate may be a glass substrate or a transparent plastic substrate with excellent mechanical strength, thermal stability, transparency, surface smoothness, ease of handling, and water resistance.

The first electrode may be formed by depositing or sputtering a first electrode-forming material on the substrate. When the first electrode is an anode, a material having a high work function may be used as the first electrode-forming material to facilitate hole injection. The first electrode may be a reflective electrode or a transmission electrode. Examples of the first electrode-forming material include indium tin oxide (ITO), indium zinc oxide (IZO), tin oxide ($SnO_2$), and zinc oxide (ZnO). When magnesium (Mg), aluminum (Al), aluminum-lithium (Al—Li), calcium (Ca), magnesium-indium (Mg—In), or magnesium-silver (Mg—Ag) are used, the first electrode may be formed as a reflective electrode.

The first electrode may have a single-layer structure or a multi-layer structure including at least two layers. For example, the first electrode may have a three-layered structure of ITO/Ag/ITO.

The organic layer may be disposed on the first electrode.

The organic layer may include an HIL, an HTL, a buffer layer (not illustrated), an EML, an ETL, or an EIL.

An HIL may be formed on the first electrode by various methods, such as vacuum deposition, spin coating, casting, and Langmuir-Blodgett (LB) deposition.

When the HIL is formed by vacuum deposition, the vacuum deposition conditions may vary according to the compound that is used to form the HIL, and the desired structure and thermal properties of the HIL to be formed. For example, the vacuum deposition may be performed at a temperature in a range of about 100° C. to about 500° C., a pressure in a range of about $10^{-8}$ torr to about $10^{-3}$ torr, and a deposition rate in a range of about 0.01 Å/sec to about 100 Å/sec.

When the HIL is formed by spin coating, the coating conditions may vary according to the compound that is used to form the HIL, and the desired structure and thermal properties of the HIL to be formed. For example, the coating rate may be in a range of about 2,000 to about 5,000 rpm, and a temperature at which heat treatment is performed to remove a solvent after coating may be in a range of about 80° C. to about 200° C.

Exemplary materials that may be used to form an HIL include N,N-diphenyl-N,N-bis-[4-(phenyl-m-tolyl-amino)-phenyl]-biphenyl-4,4-diamine, (DNTPD), a phthalocyanine compound such as copper phthalocyanine, 4,4',4"-tris(3-methylphenylphenylamino)triphenylamine (m-MTDATA), N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), and polyaniline/poly(4-styrenesulfonate) (PANI/PSS):

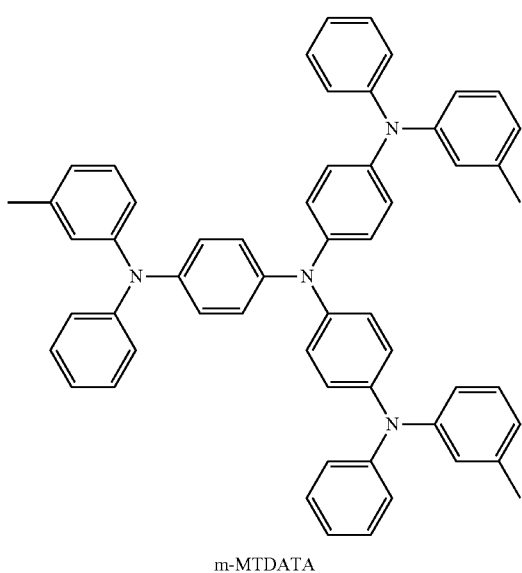

m-MTDATA

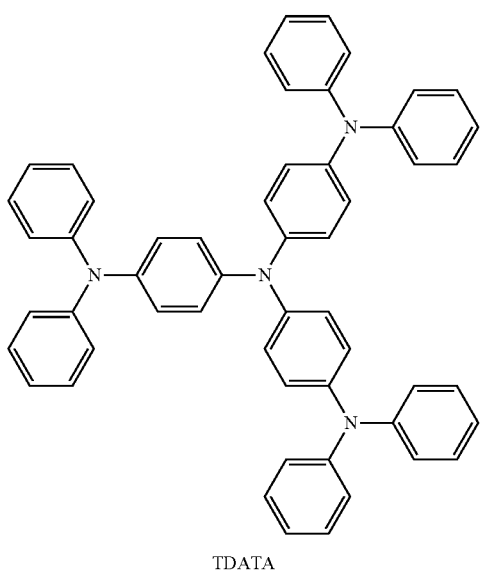

TDATA

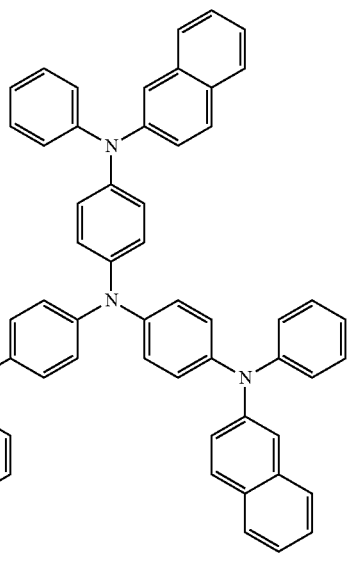

2-TNATA

A thickness of the HIL may be in a range of about 100 Å to about 10,000 Å, for example, about 100 Å to about 1,000 Å. Maintaining the thickness of the HIL within the above ranges may help provide the HIL with satisfactory hole injecting capabilities without a substantial increase in a driving voltage.

Then, an HTL may be formed on the HIL by various methods, such as vacuum deposition, spin coating, casting, and LB deposition. When the HTL is formed by vacuum deposition or spin coating, the deposition and coating conditions may be similar to those for the formation of the HIL, although the deposition and coating conditions may vary according to the compound that is used to form the HTL.

Exemplary materials that may be used to form an HTL include a carbazole derivative such as N-phenylcarbazole and polyvinylcarbazole, N,N'-bis(3-methylphenyl)-N,N-diphenyl-[1,1-biphenyl]-4,4'-diamine (TPD), 4,4',4"-tris(N-carbazolyl)triphenylamine) (TCTA), and N,N'-di(1-naphthyl)-N,N'-diphenylbenzidine (NPB):

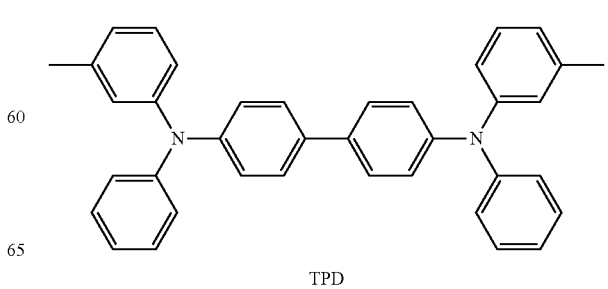

TPD

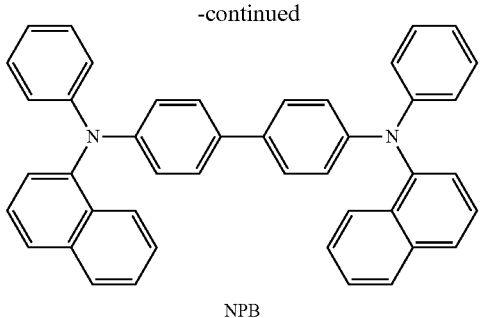

NPB

A thickness of the HTL may be in a range of about 50 Å to about 2,000 Å, for example, about 100 Å to about 1,500 Å. Maintaining the thickness of the HTL within the above ranges may help provide the HTL with satisfactory hole transporting capabilities without a substantial increase in a driving voltage.

The H-functional layer (having both hole injection and hole transport capabilities) may include at least one material selected from the above-described materials for the HIL and the HTL. A thickness of the H-functional layer may be in a range of about 50 Å to about 10,000 Å, for example, about 100 Å to about 1,000 Å. Maintaining the thickness of the H-functional layer within the above ranges may help provide the H-functional layer with satisfactory hole injecting and transporting capabilities without a substantial increase in a driving voltage.

In some embodiments, at least one layer of the HIL, the HTL, and the H-functional layer may include at least one of compounds represented by Formulae 300 and 350 below:

<Formula 300>

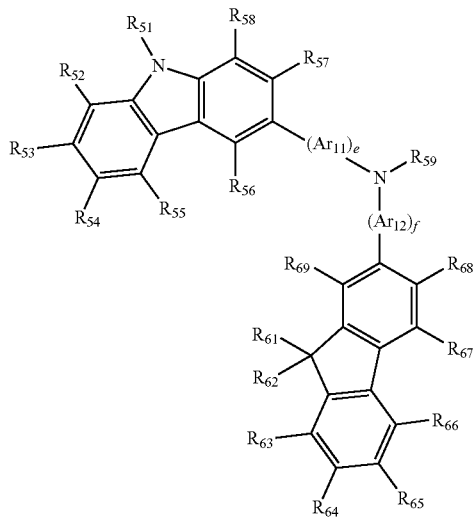

<Formula 350>

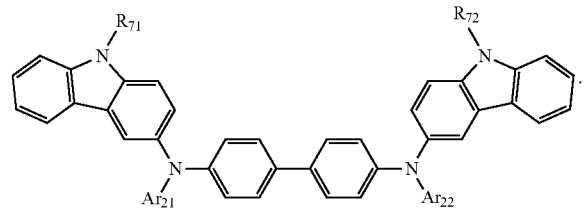

In Formulae 300 and 350, $Ar_{11}$, $Ar_{12}$, $Ar_{21}$, and $Ar_{22}$ may each independently be a substituted or unsubstituted $C_5$-$C_{60}$ arylene group.

In Formula 300, e and f may each independently be an integer of 0 to 5, for example, 0, 1, or 2. In some embodiments, e may be 1 and f may by 0.

In Formulae 300 and 350, $R_{51}$ to $R_{58}$, $R_{61}$ to $R_{69}$, $R_{71}$, and $R_{72}$ may each independently be a hydrogen atom, a deuterium atom, a halogen group, a hydroxyl group, a cyano group, a nitro group, an amino group, an aminido group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, or a substituted or unsubstituted $C_5$-$C_{60}$ arylthio group. For example, $R_{51}$ to $R_{58}$, $R_{61}$ to $R_{69}$, $R_{71}$, and $R_{72}$ may each independently be a hydrogen atom; a deuterium atom; a halogen group; a hydroxyl group; a cyano group; a nitro group; an amino group; an amidino group; a hydrazine; a hydrazone; a carboxyl group or a salt thereof; a sulfonic acid group or a salt thereof; a phosphoric acid group or a salt thereof; a $C_1$-$C_{10}$ alkyl group (e.g., a methyl group, an ethyl group, a propyl group, a butyl group, a pentyl group, and a hexyl group); a $C_1$-$C_{10}$ alkoxy group (e.g., a methoxy group, an ethoxy group, a propoxy group, a butoxy group, and a pentoxy group); a $C_1$-$C_{10}$ alkyl group and a $C_1$-$C_{10}$ alkoxy group, each substituted with at least one substituent selected from a deuterium atom, a halogen group, a hydroxyl group, a cyano group, a nitro group, an amino group, an amidino group, a hydrazine, a hydrazone, a carboxyl group or a salt thereof, a sulfonic group acid or a salt thereof, and a phosphoric acid group or a salt thereof; a phenyl group; a naphthyl group; an anthryl group; a fluorenyl group; a pyrenyl group; and a phenyl group, a naphthyl group, an anthryl group, a fluorenyl group, and a pyrenyl group, each substituted with at least one substituent selected from a deuterium atom, a halogen group, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{10}$ alkyl group, and a $C_1$-$C_{10}$ alkoxy group.

In Formula 300, $R_{59}$ may be a phenyl group; a naphthyl group; an anthryl group; a biphenyl group; a pyridyl group; and a phenyl group, a naphthyl group, an anthryl group, a biphenyl group, and a pyridyl group, each substituted with at least one substituent selected from a deuterium atom, a halogen group, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{20}$ alkyl group, and a substituted or unsubstituted $C_1$-$C_{20}$ alkoxy group.

According to another embodiment, the compound of Formula 300 may be a compound represented by Formula 300A below:

<Formula 300A>
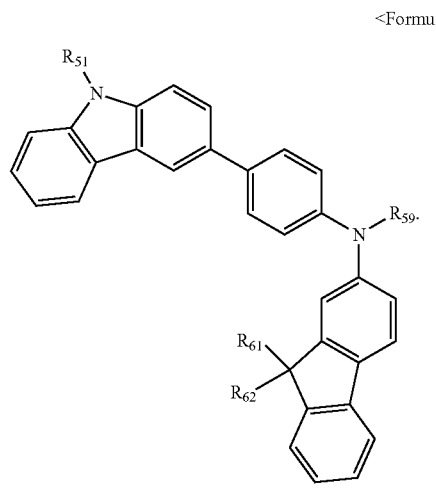
In Formula 300 Å, $R_{51}$, $R_{61}$, $R_{62}$, and $R_{59}$ may be as defined above.
For example, at least one layer of the HIL, HTL, and the H-functional layer may include at least one of Compounds 301 to 320:
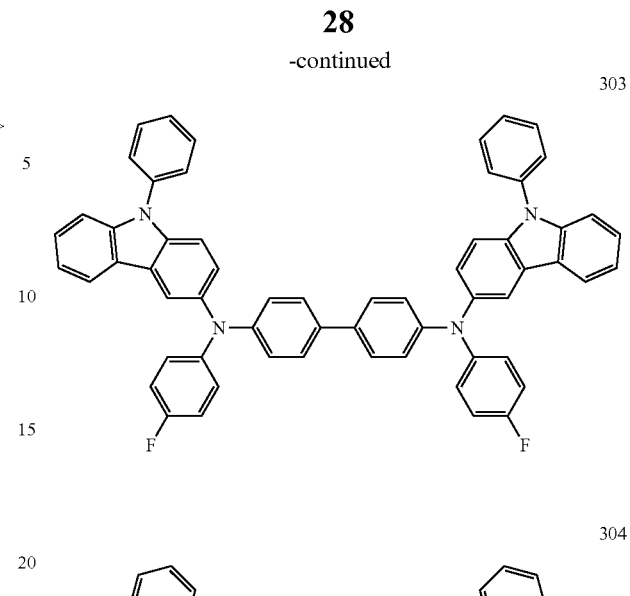

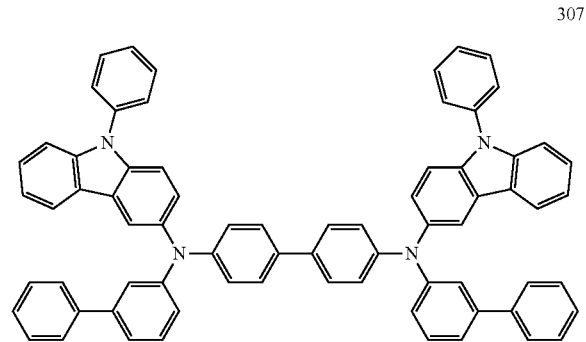
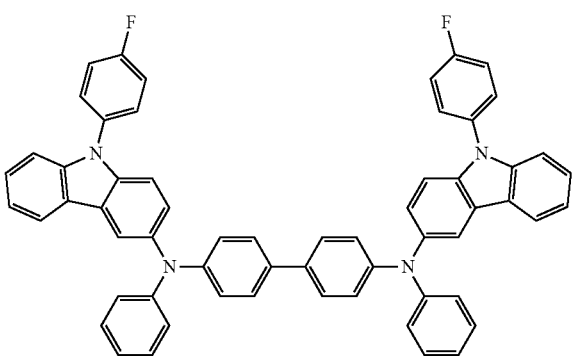
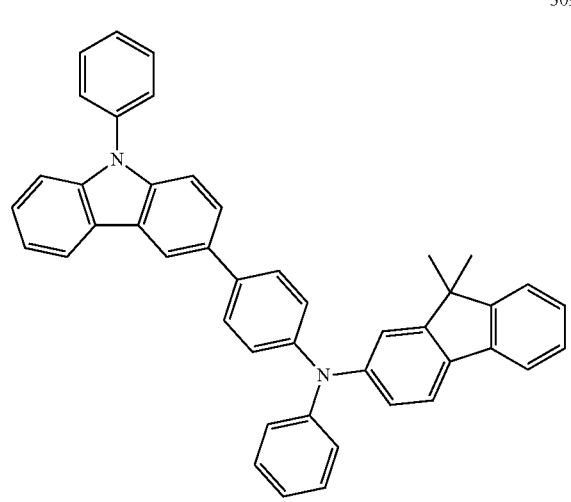
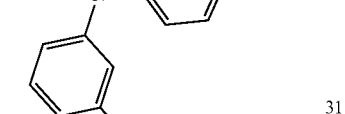
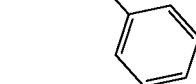
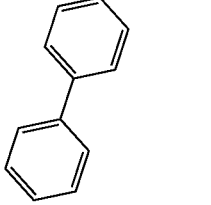

31
-continued
32
-continued
313
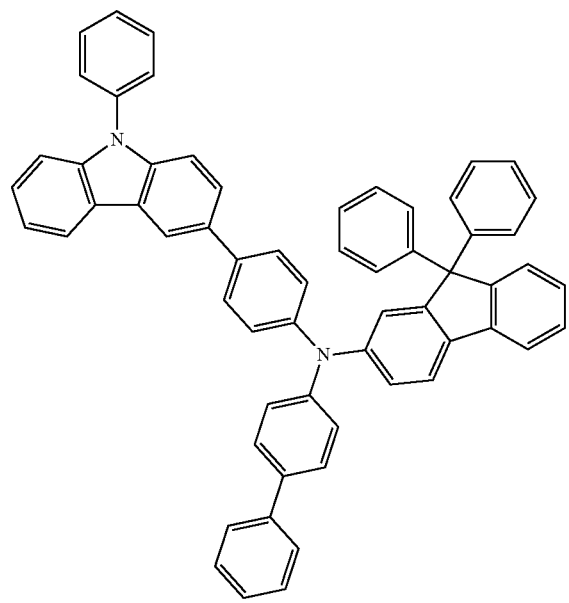
315
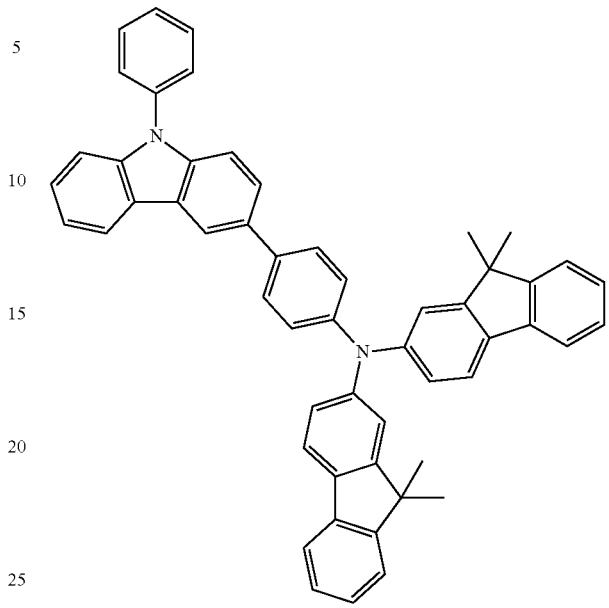
316
314
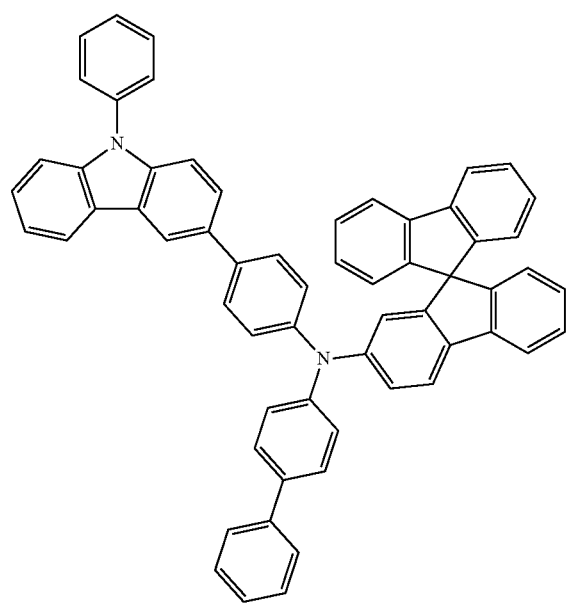
317
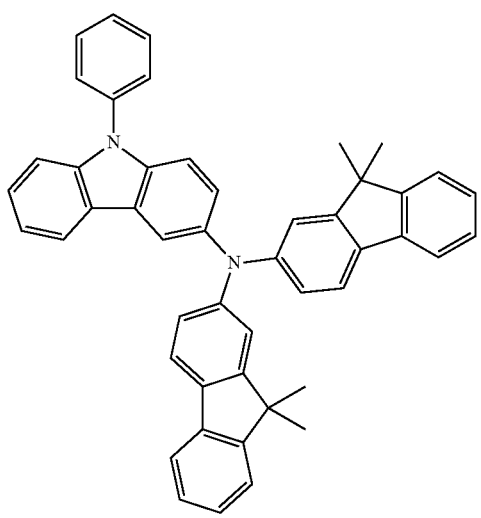

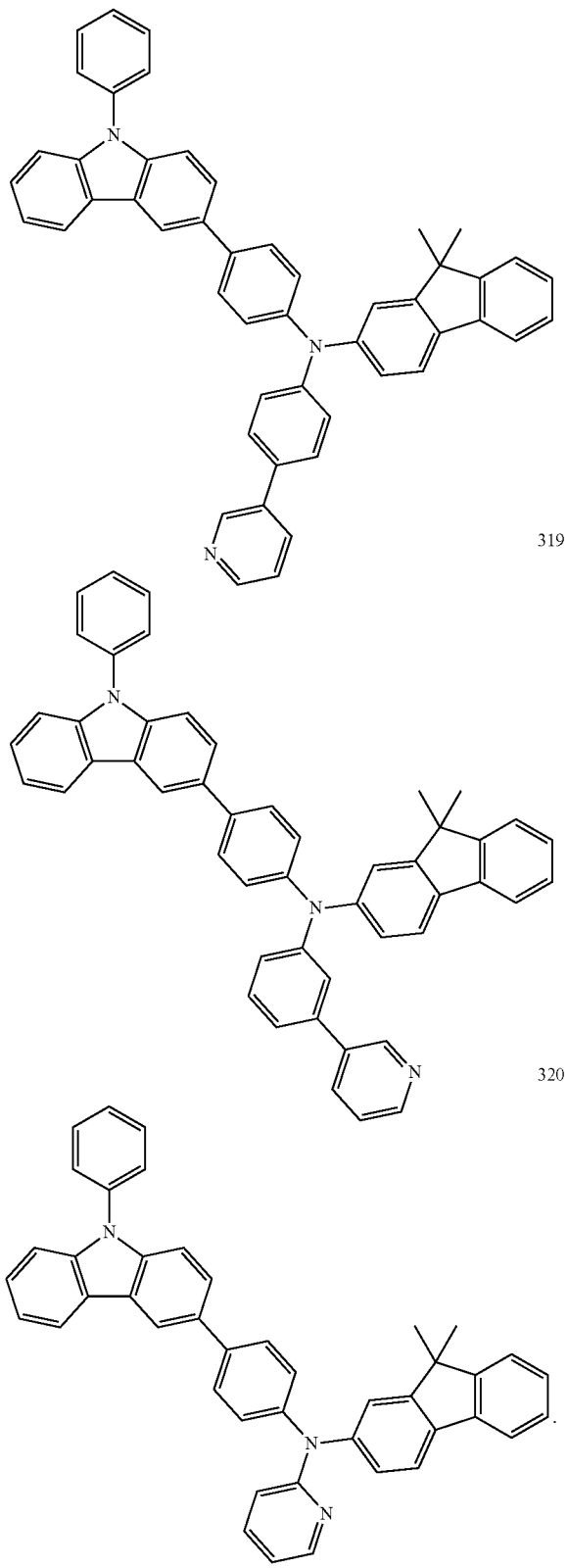

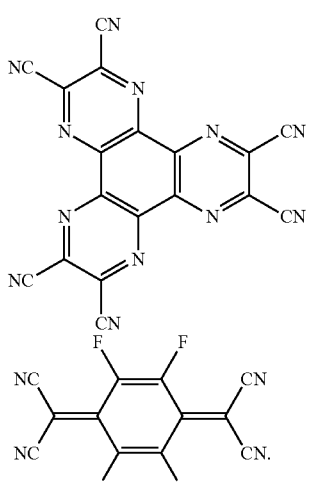

or H-functional materials having both hole injection and hole transport capabilities, to improve conductivity of a film.

The charge-generating material may be, for example, a p-dopant. Exemplary p-dopants include quinone derivatives, such as tetracyanoquinodimethane (TCNQ) and 2,3,5,6-tetrafluoro-tetracyano-1,4-benzoquinodimethane (F4-TCNQ); metal oxides, such as a tungsten oxide and a molybdenym oxide; and cyano group-containing compound, such as Compound 200 below:

<Compound 200>

<F4-TCNQ>

When the HIL, the HTL, or the H-functional layer includes the charge-generating material, the charge-generating material may be homogeneously dispersed or non-homogeneously distributed throughout the above-described layers.

A buffer layer may be disposed between at least one of the HIL, HTL, and the H-functional layer, and the EML. The buffer layer may compensate for an optical resonance distance of light according to a wavelength of the light emitted from the EML, and may increase efficiency. The buffer layer may include any hole injecting material or hole transporting material. In some other embodiments, the buffer layer may include the same material as one of the materials included in the HIL, the HTL, and the H-functional layer that underlie the buffer layer.

Then, an EML may be formed on the HIL, the H-functional layer, or the buffer layer by vacuum deposition, spin coating, casting, or LB deposition. When the EML is formed by vacuum deposition or spin coating, the deposition and coating conditions may be similar to those for the formation of the HIL, although the conditions for deposition and coating may vary according to the compound that is used to form the EML.

The EML may include a compound represented by Formula 1 or a host and a dopant. In regard to the dopant, the compound represented by Formula 1, a fluorescent dopant, or a phosphorescent dopant may be used.

For example, the host may be $Alq_3$, 4,4'-N,N'-dicarbazole-biphenyl (CBP), poly(n-vinylcarbazole) (PVK), 9,10-di(naphthylene-2-yl)anthracene (ADN), TCTA, 1,3,5-tris(N-phenylbenzimidazole-2-yl)benzene (TPBI), 3-tert-butyl-9,10-di(naphth-2-yl) anthracene (TBADN), E3, distyrylarylene (DSA), dmCBP (see Formula below), or Compounds 501 to 509 below:

At least one layer of the HIL, HTL, and the H-functional layer may include a charge-generating material in addition to hole-injecting materials, hole-transporting materials, and/

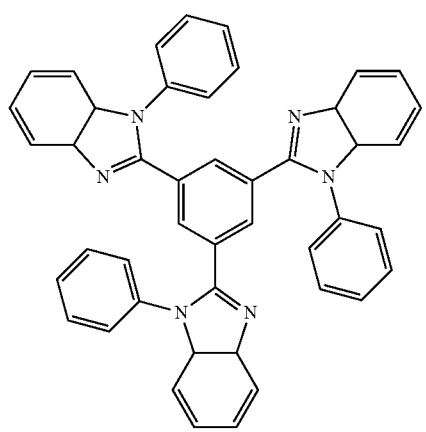
TPBI
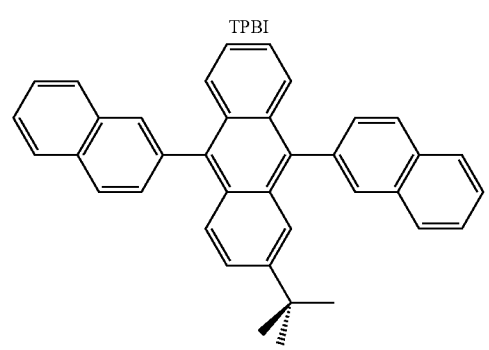
TBADN
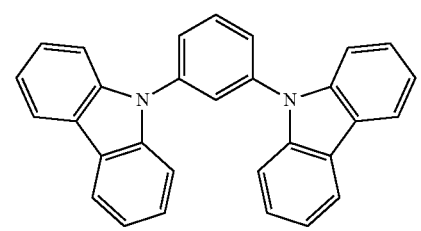
dmCBP
E3
PVK
501
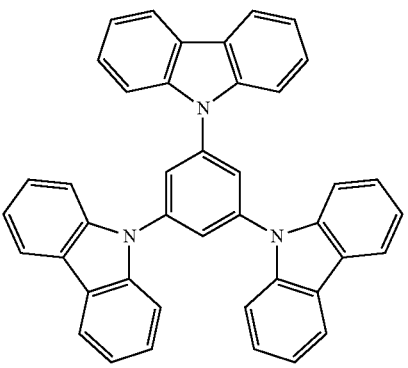
502
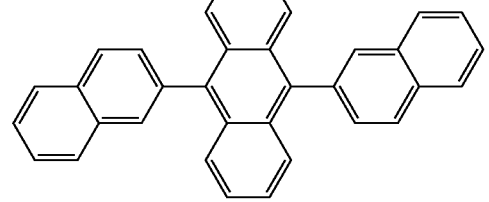
ADN
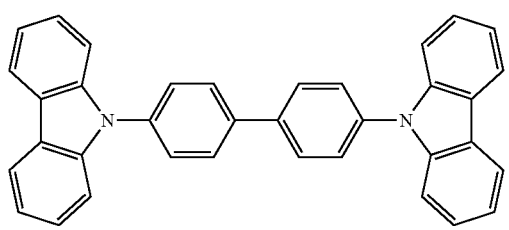
CBP
503
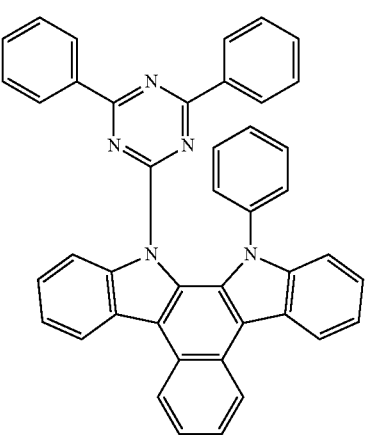

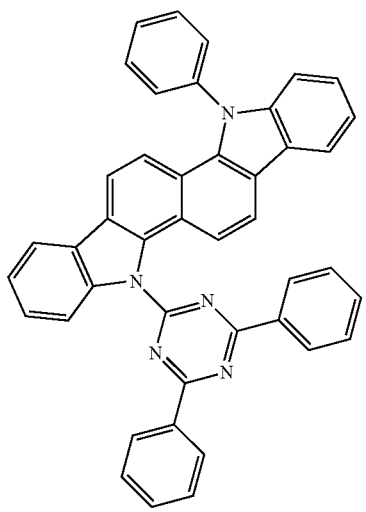

504

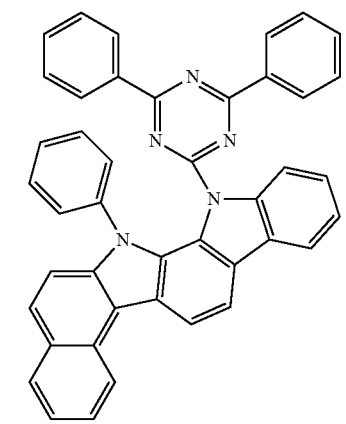

505

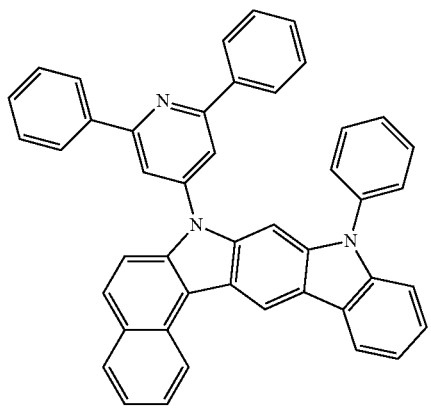

506

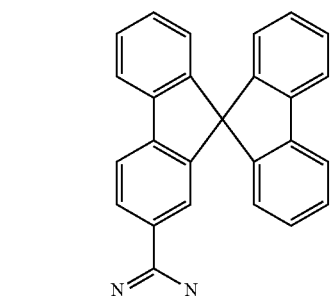

507

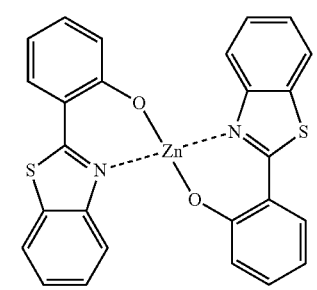

508

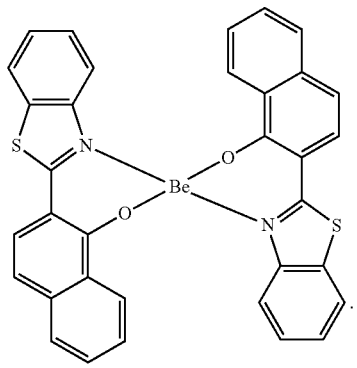

509

In some embodiments, an anthracene-based compound represented by Formula 400 below may be used as the host:

<Formula 400>

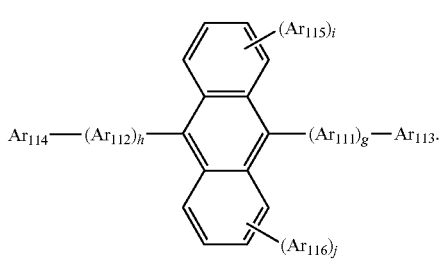

In Formula 400, $Ar_{111}$ and $Ar_{112}$ may each independently be a substituted or unsubstituted $C_5$-$C_{60}$ arylene group; $Ar_{113}$ to $Ar_{16}$ may each independently be a substituted or unsubstituted $C_1$-$C_{10}$ alkyl group, or a substituted or unsubstituted $C_5$-$C_{60}$ aryl group; and g, h, I, and j may each independently be an integer of 0 to 4.

In some embodiment, in Formula 400, $Ar_{111}$ and $Ar_{112}$ may each independently be a phenylene group, a naphthylene group, a phenanthrenylene group, or a pyrenylene group; or a phenylene group, a naphthylene group, a phenanthrenylene group, a fluorenyl group, or a pyrenylene group, each substituted with at least one substituent selected from a phenyl group, a naphthyl group, and an anthryl group.

In Formula 400, g, h, I and j may each independently be, 0, 1, or 2.

In Formula 400, $Ar_{113}$ to $Ar_{116}$ may each independently be a $C_1$-$C_{10}$ alkyl group substituted with at least one of a phenyl group, a naphthyl group, and an anthryl group; a phenyl group; a naphthyl group; an anthryl group; a pyrenyl group; a phenanthrenyl group; a fluorenyl group; a phenyl group, a naphthyl group, an anthryl group, a pyrenyl group, a phenanthrenyl group, and a fluorenyl group, each substituted with at least one substituent selected from a deuterium atom, a halogen group, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, and a fluorenyl group; and

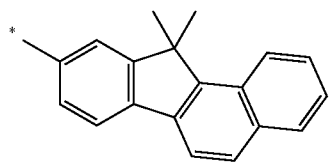

In some embodiments, the anthracene-based compound of Formula 400 above may be one of compounds represented by the Formulae below:

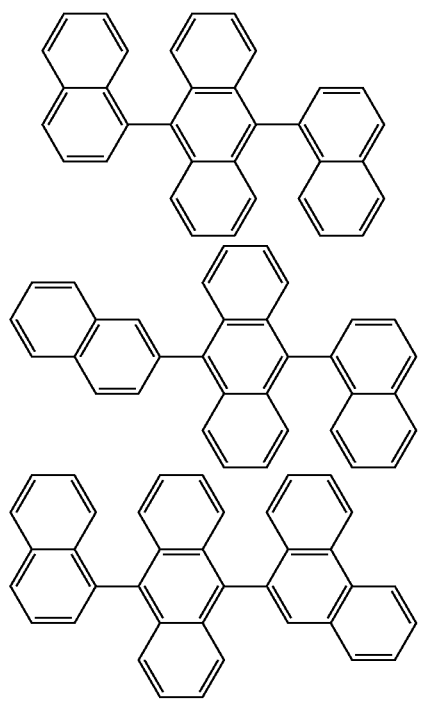

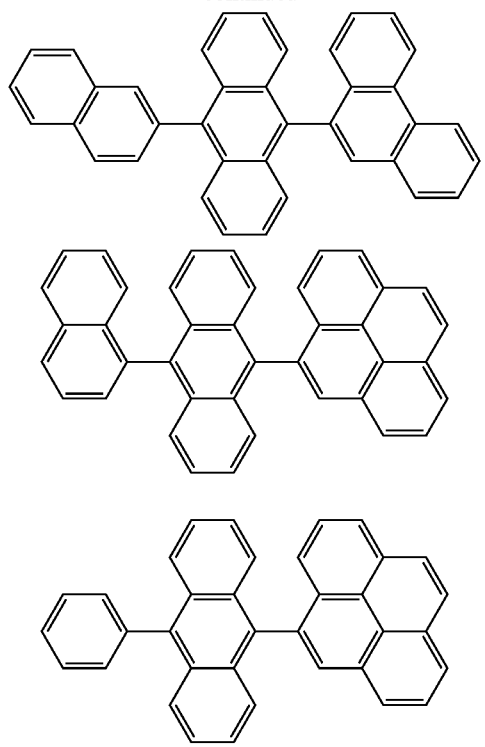

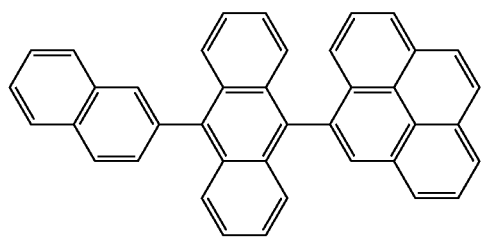

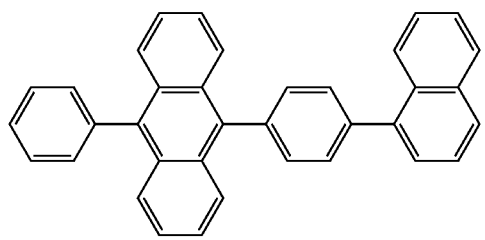

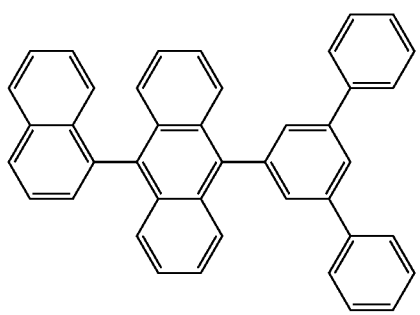

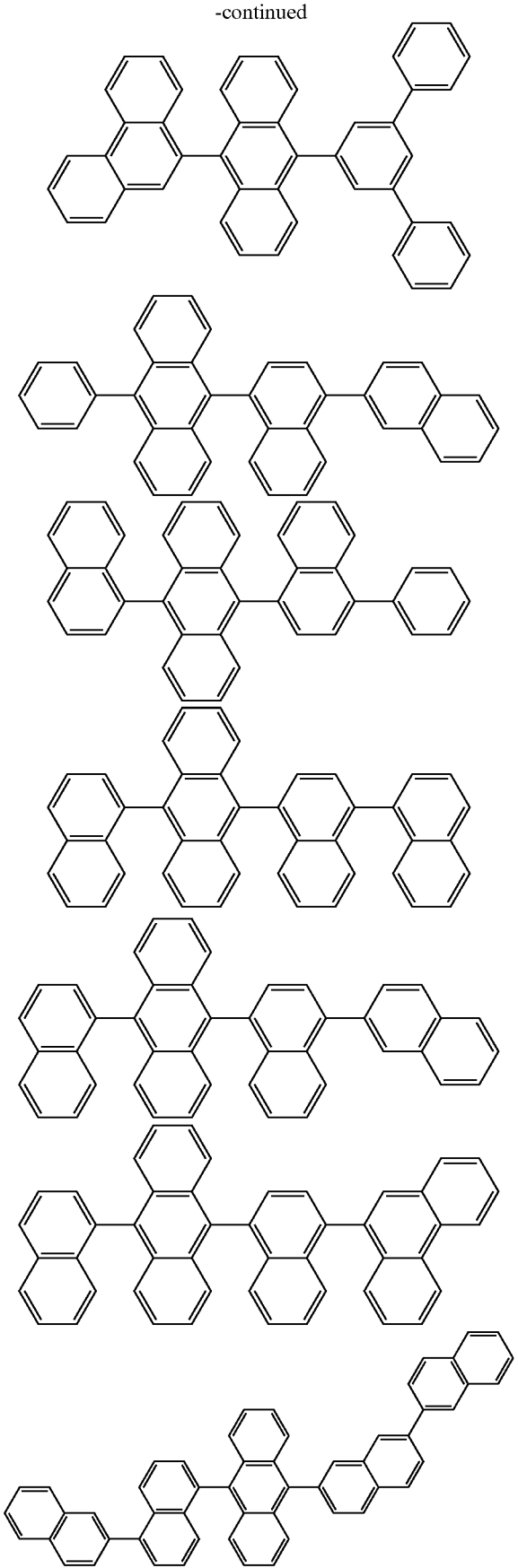

-continued
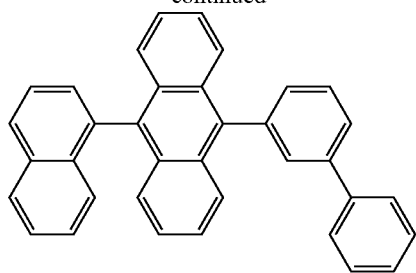
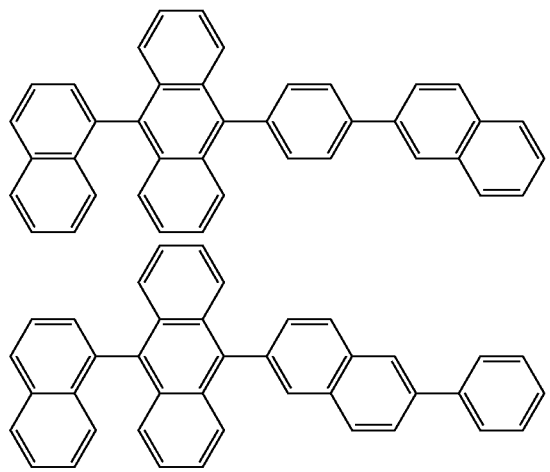
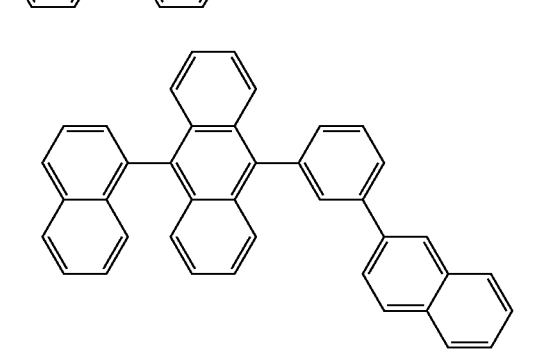
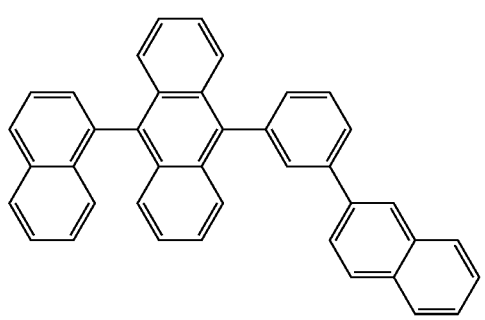
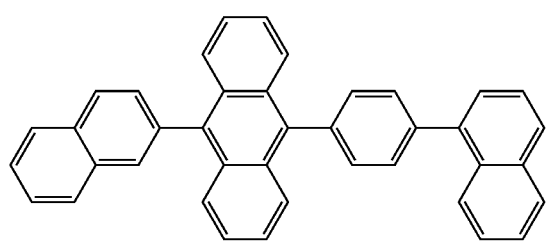
-continued
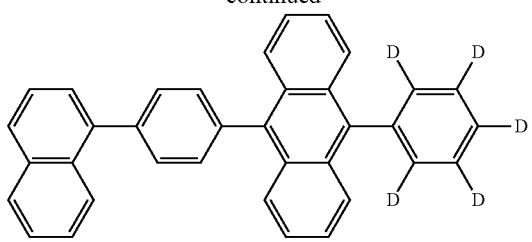
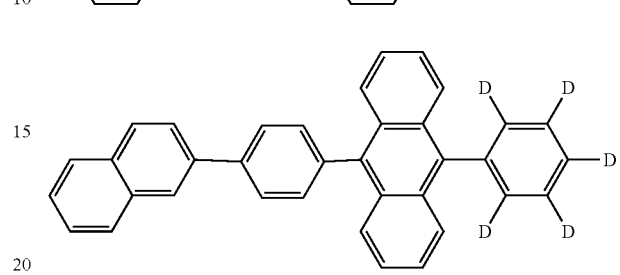
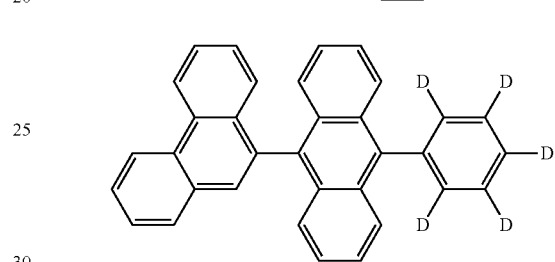
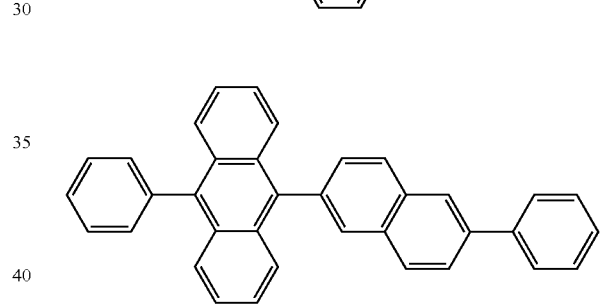
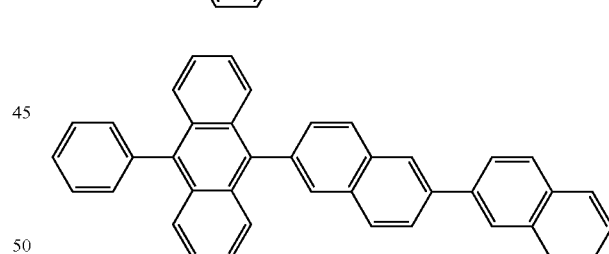
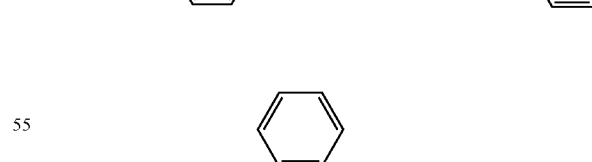
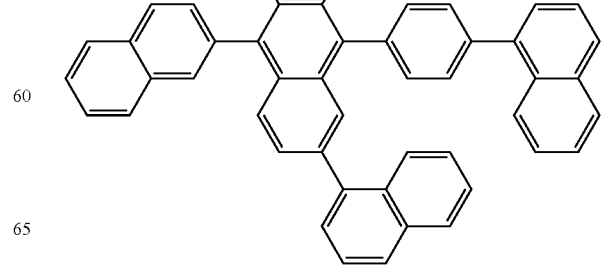

-continued

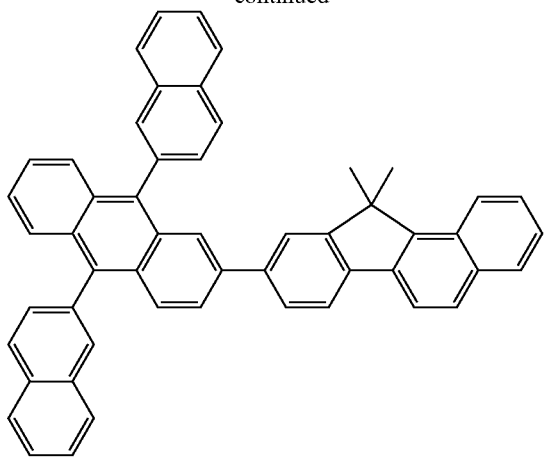

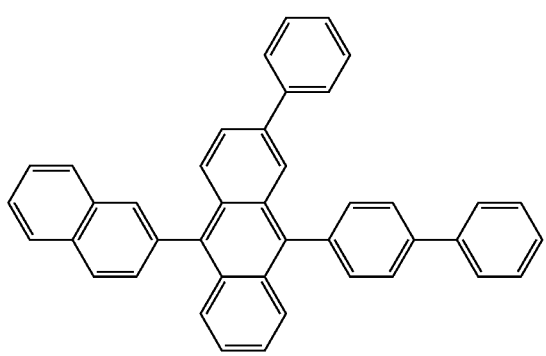

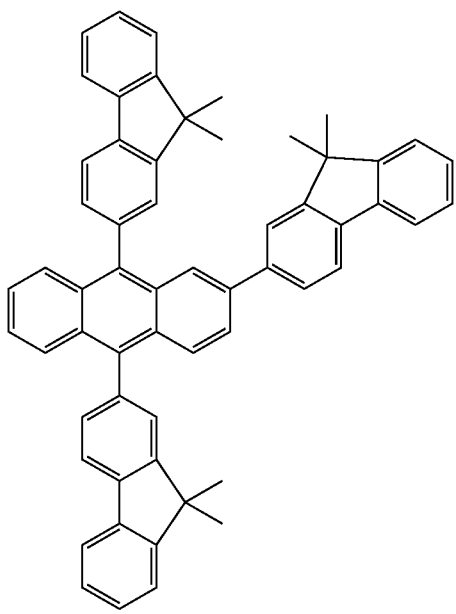

-continued

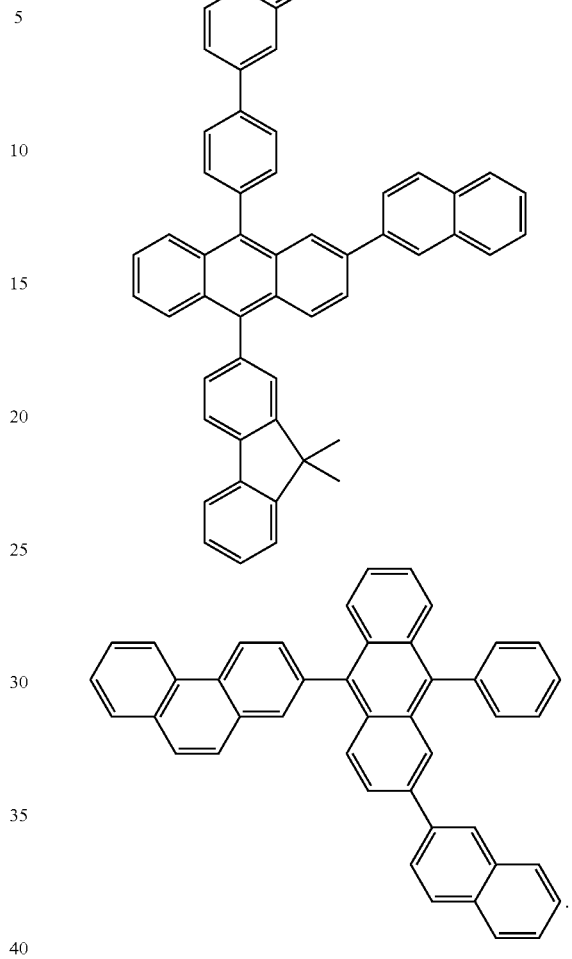

In some embodiments, an anthracene-based compound represented by Formula 401 below may be used as the host:

<Formula 401>

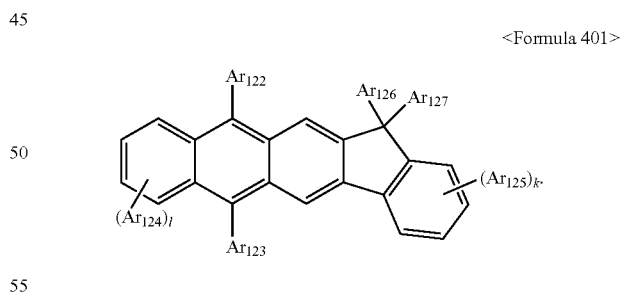

In Formula 401, $Ar_{122}$ to $Ar_{125}$ may be defined as described above in conjunction with $Ar_{113}$ of Formula 400, and thus detailed descriptions thereof will not be provided here.

In Formula 401 above, $Ar_{126}$ and $Ar_{127}$ may each independently be a $C_1$-$C_{10}$ alkyl group (e.g., a methyl group, an ethyl group, or a propyl group).

In Formula 401 above, k and l may each independently be an integer from 0 to 4, for example, 0, 1, or 2.

In some embodiments, the anthracene compound of Formula 401 above may be one of compounds represented by the Formulae below:

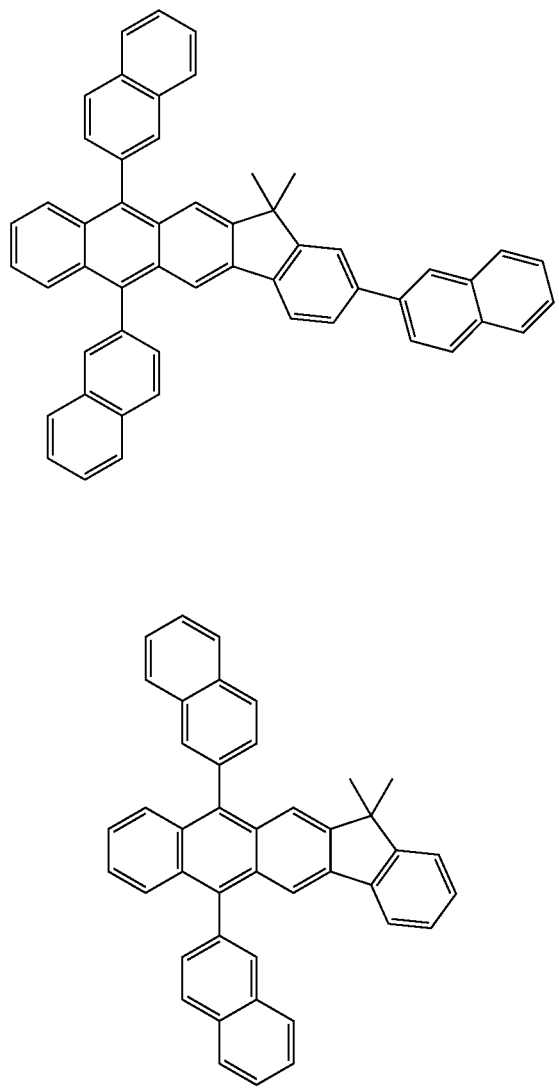
When the OLED is a full color OLED, the EML may be patterned into a red EML, a green EML, and a blue EML.
Meanwhile, at least one layer of the red EML, the green EML, and the blue EML may include one of dopants below (ppy=phenylpyridine).
Examples of the blue dopant include the compound represented by Formula 1 or compounds represented by the Formulae below:
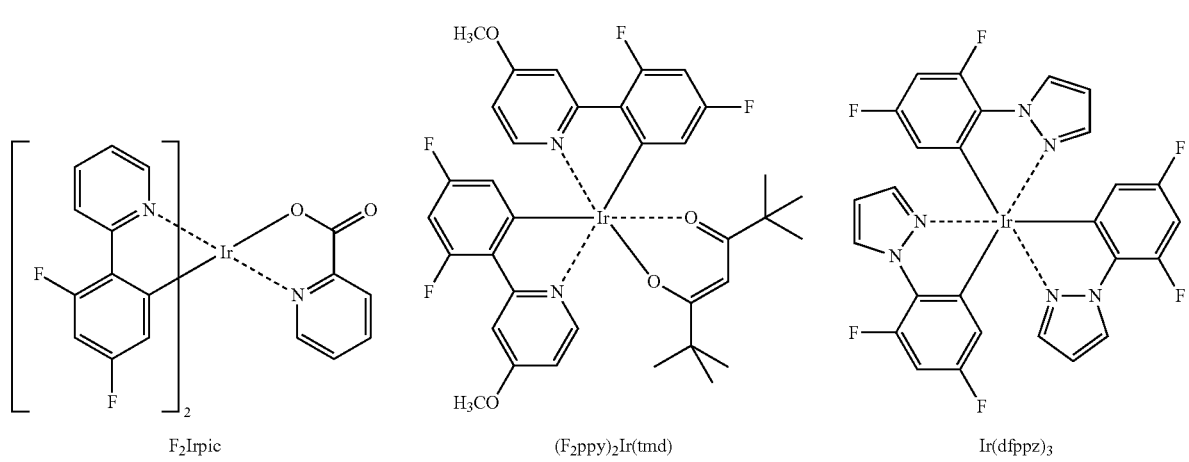

-continued
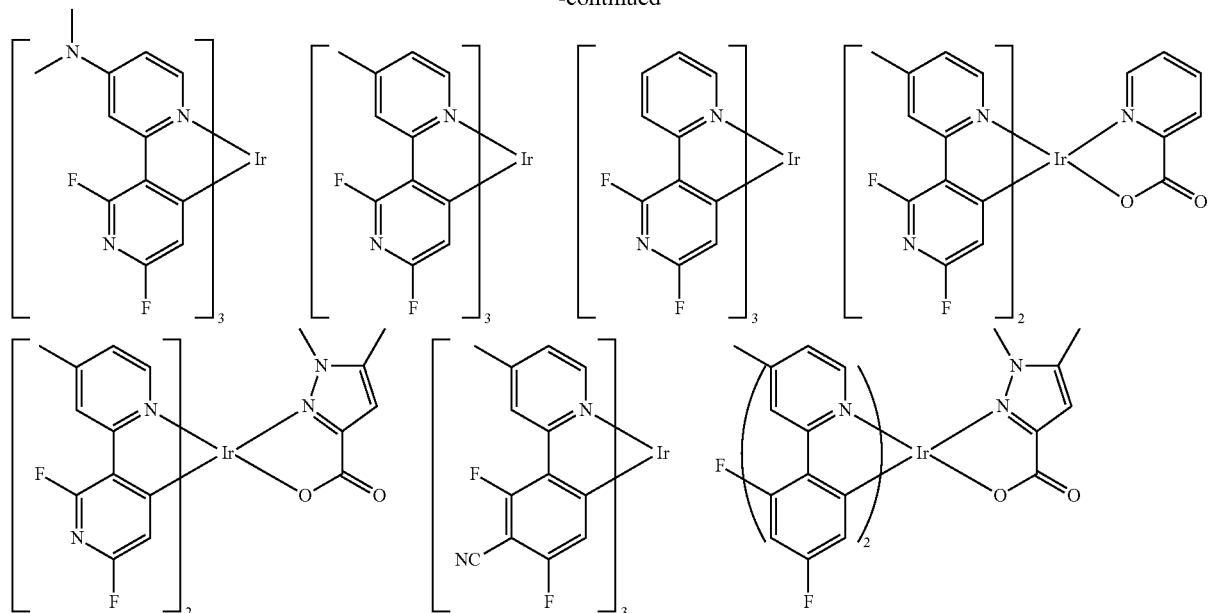
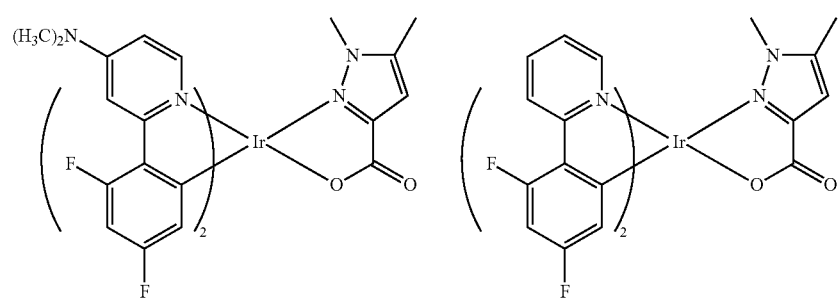
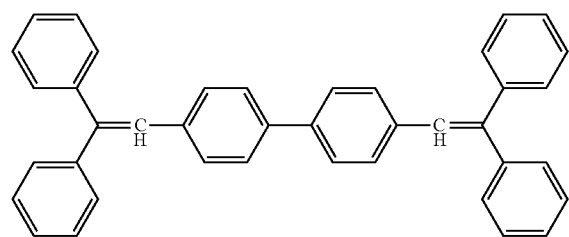
DPVBi
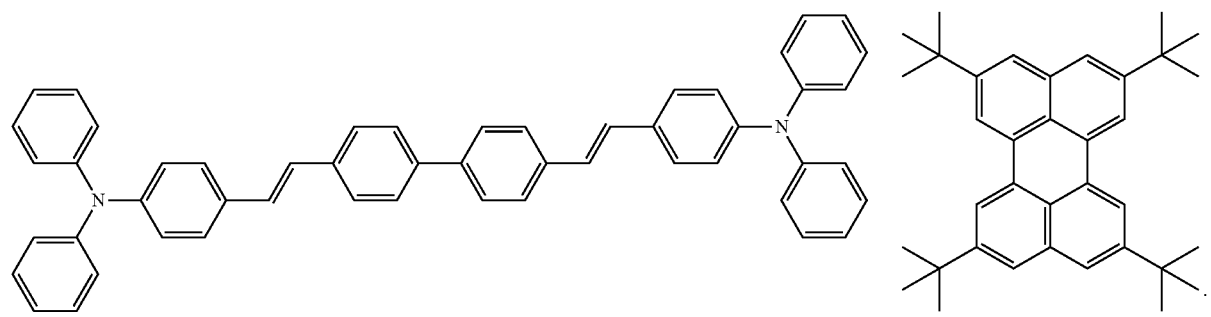
DPAVBi
TBPe

Examples of the red dopant include compounds represented by the Formulae below:
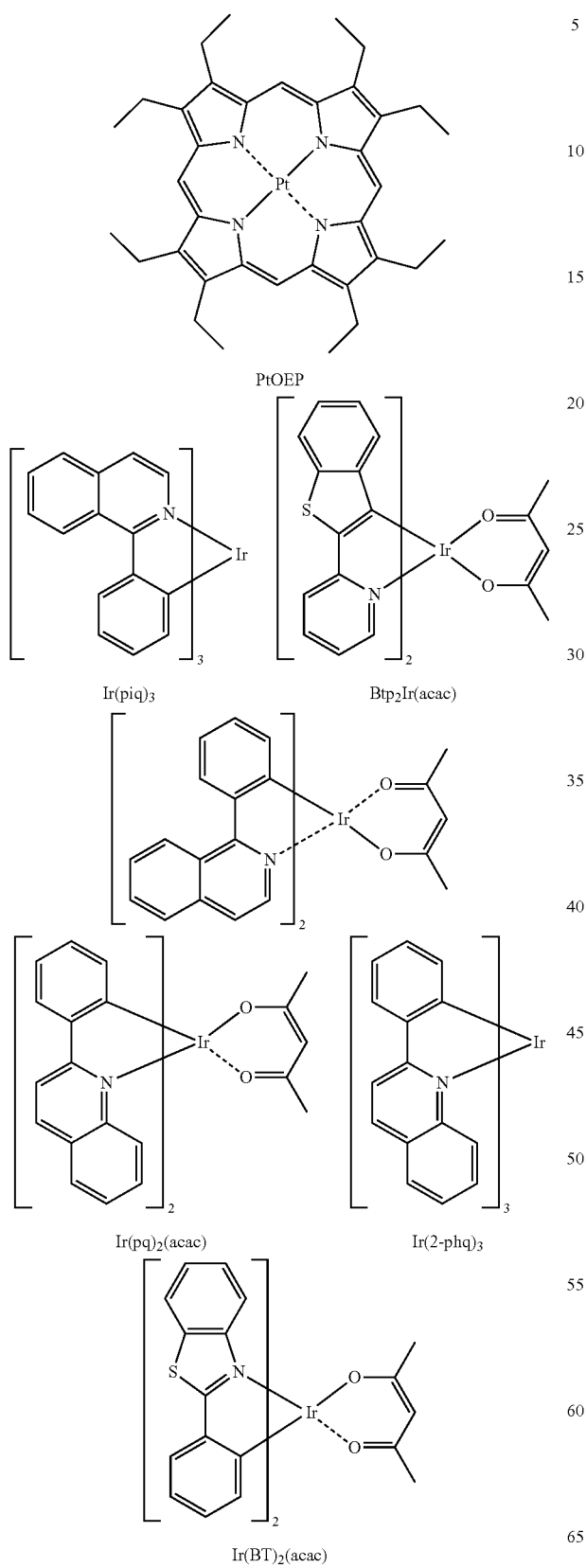
PtOEP
Ir(piq)$_3$
Btp$_2$Ir(acac)
Ir(pq)$_2$(acac)
Ir(2-phq)$_3$
Ir(BT)$_2$(acac)
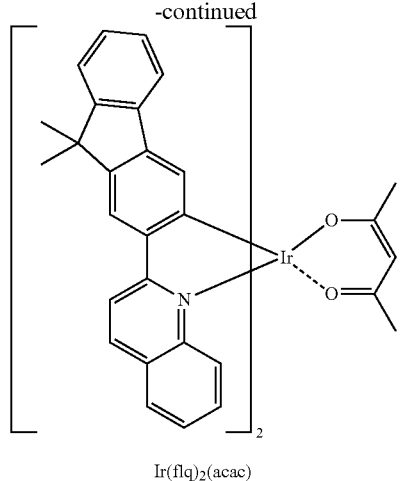
Ir(flq)$_2$(acac)
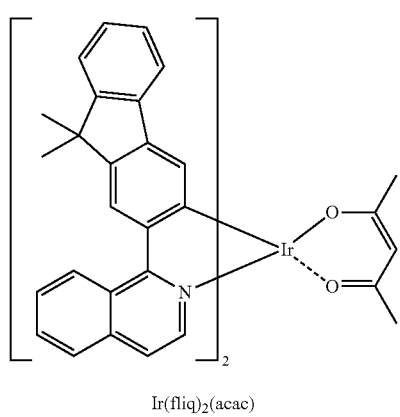
Ir(fliq)$_2$(acac)
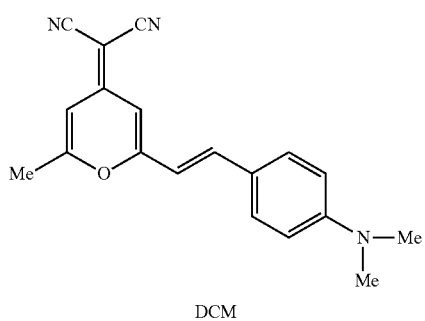
DCM
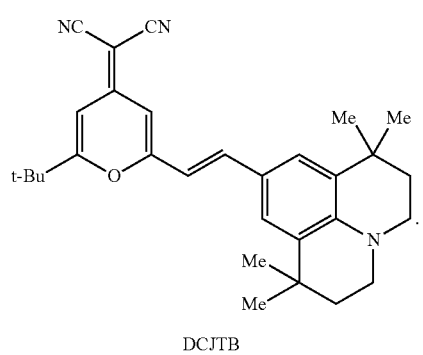
DCJTB
Examples of the green dopant include compounds represented by the Formulae below:

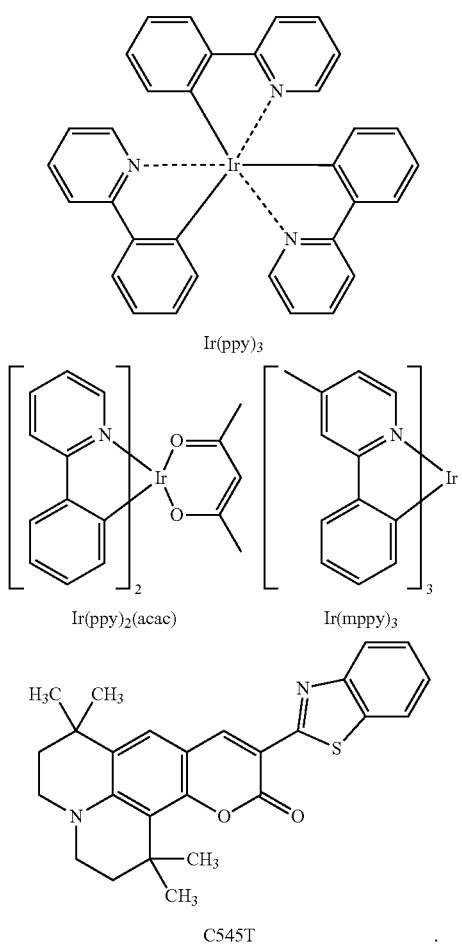
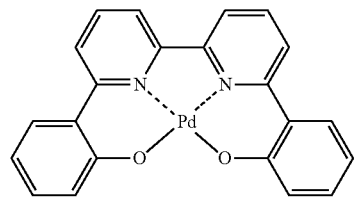
A dopant used in the EML may be a Pd-complex or a Pt-complex represented by the Formulae below:
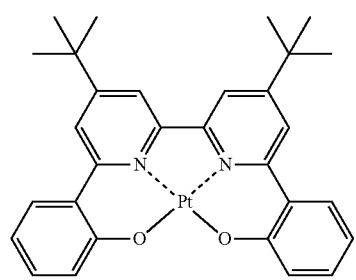
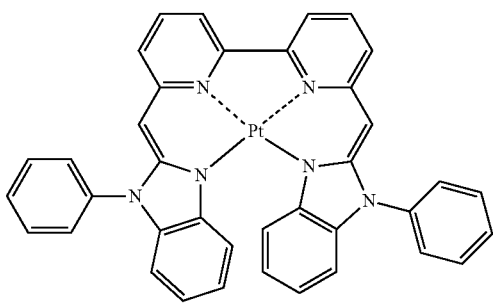
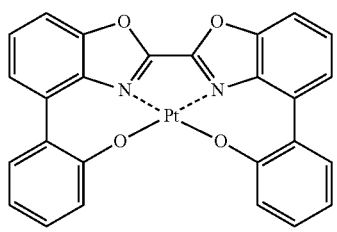
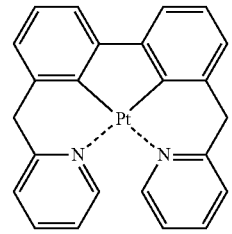
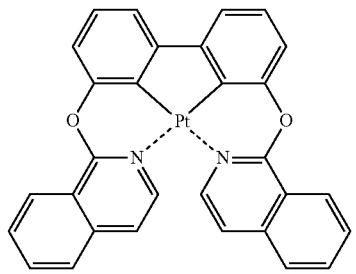
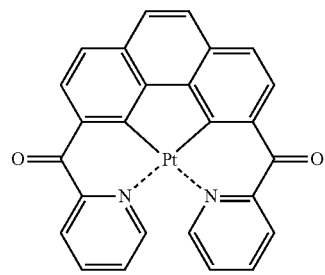
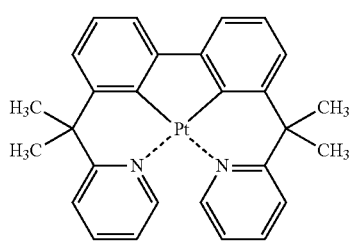

D9 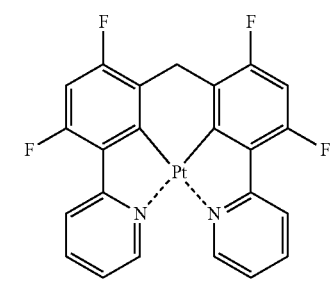
D10 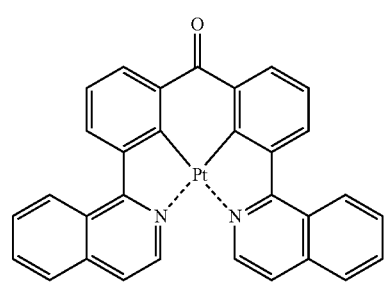
D11 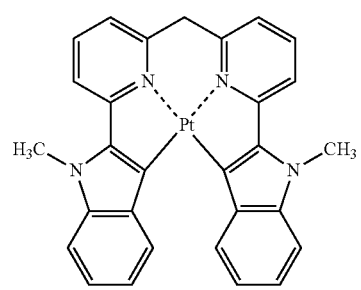
D12 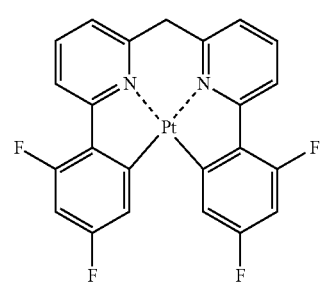
D13 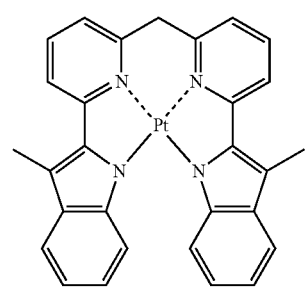
D14 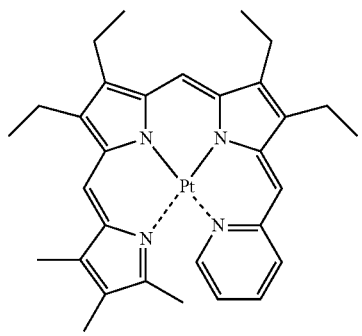
D15 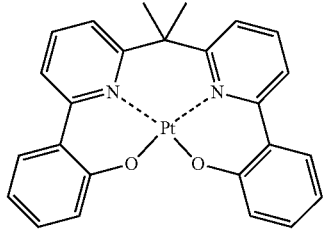
D16 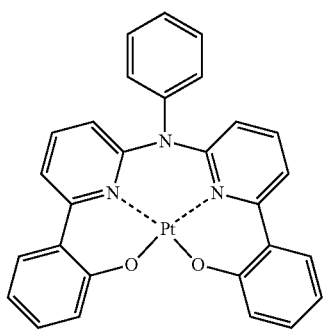
D17 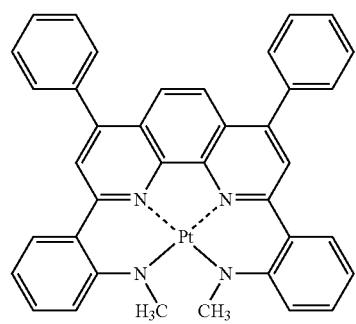
D18 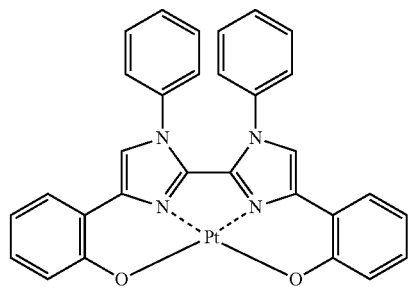

-continued
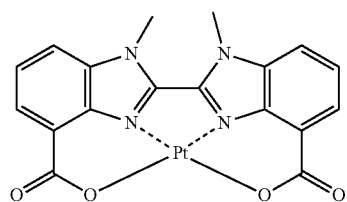
D19
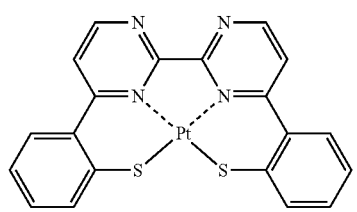
D20
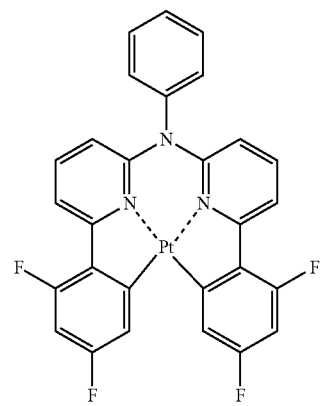
D21
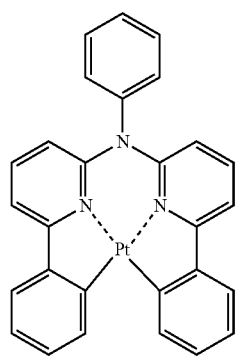
D22
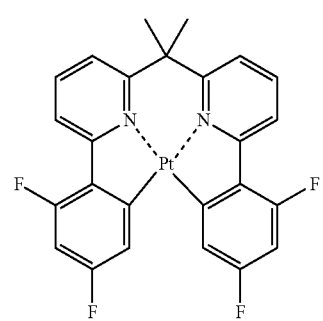
D23
-continued
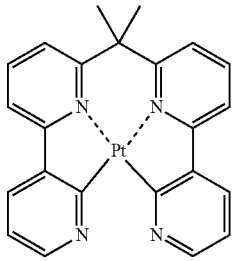
D24
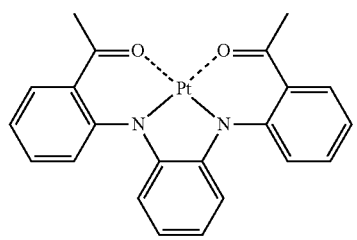
D25
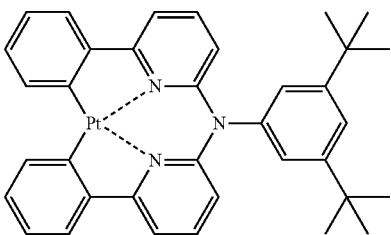
D26
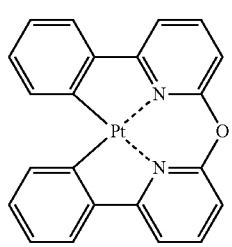
D27
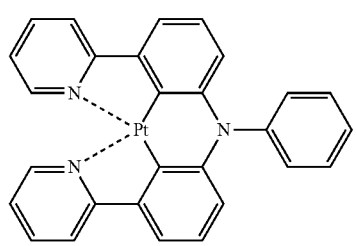
D28
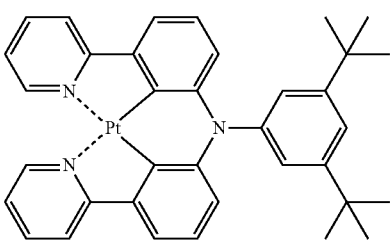
D29

D30 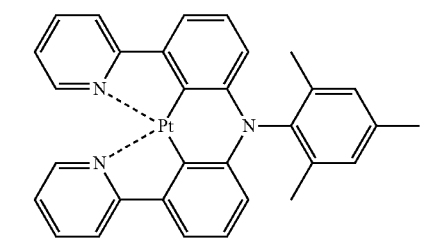
D31 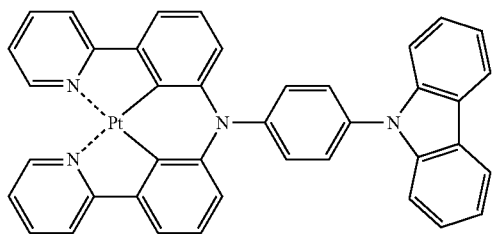
D32 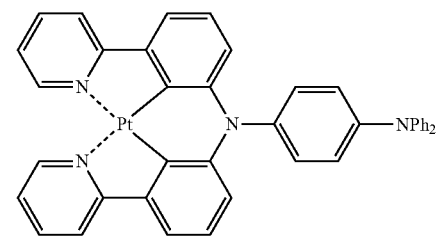
D33 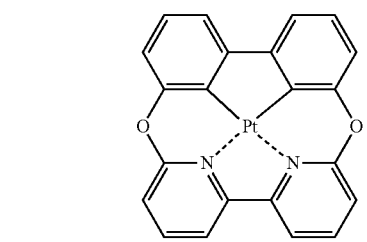
D34 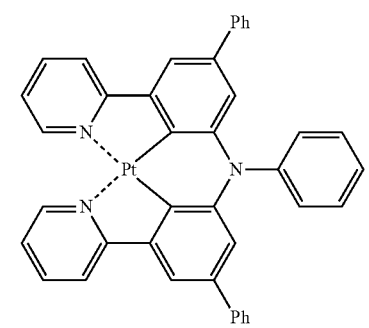
D35 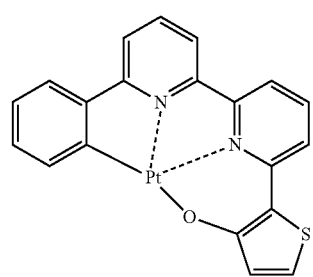
D36 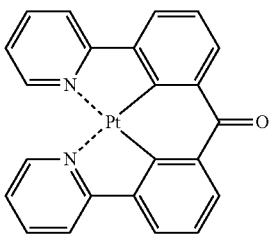
D37 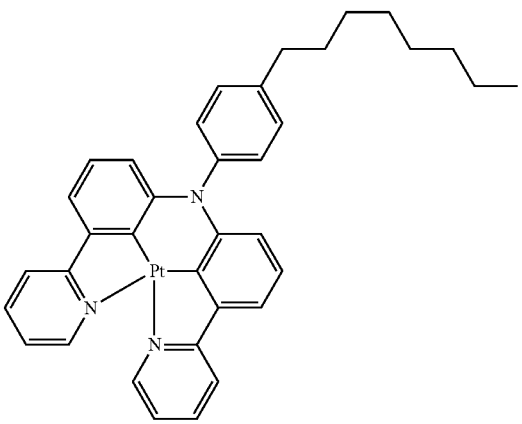
D38 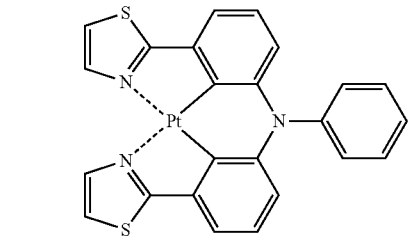
D39 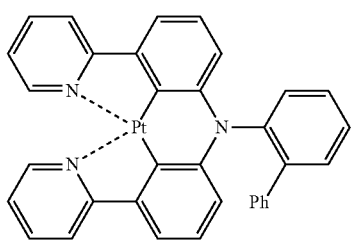
D40 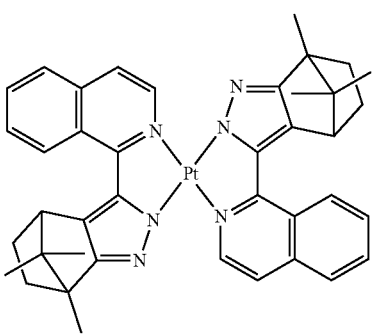

-continued
D41
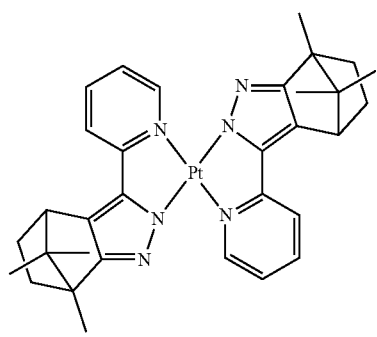
D42
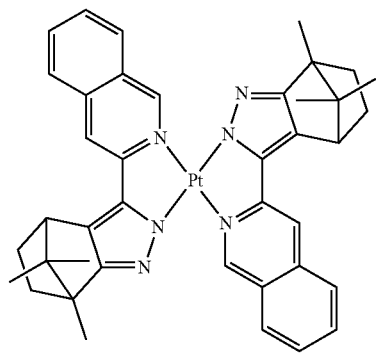
D43
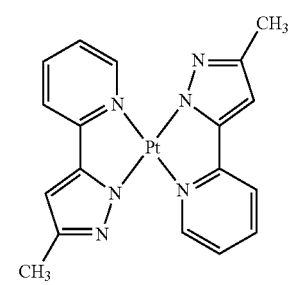
D44
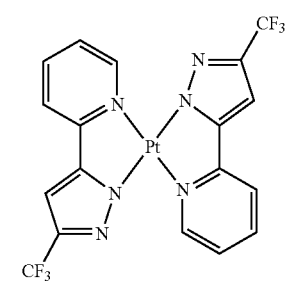
D45
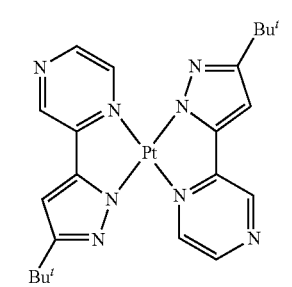
-continued
D46
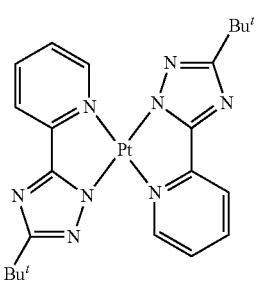
D47
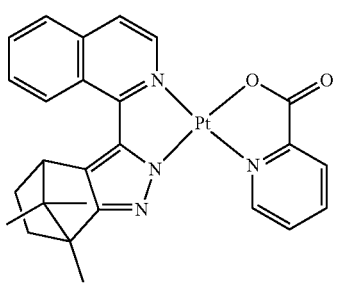
D48
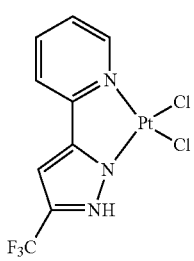
D49
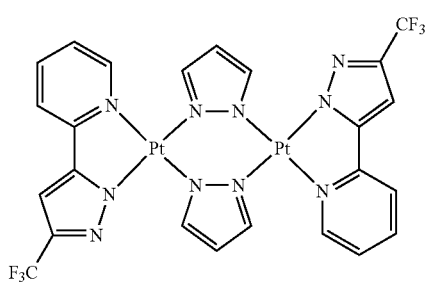
D50
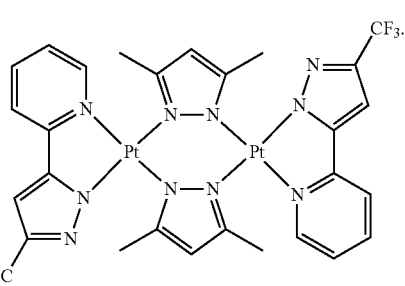
Alternatively, a dopant used in the EML may be an Os-complex represented by the Formulae below:

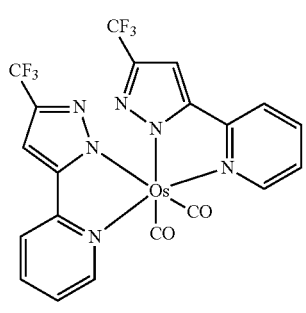

Os(fppz)$_2$(CO)$_2$

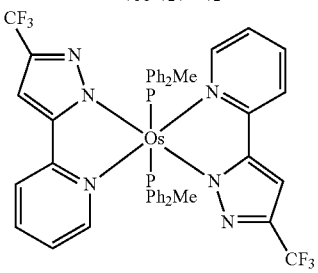

Os(fppz)$_2$(PPh$_2$Me)$_2$

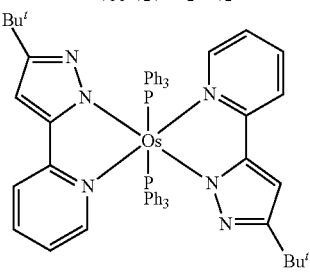

Os(bppz)$_2$(PPh$_3$)$_2$

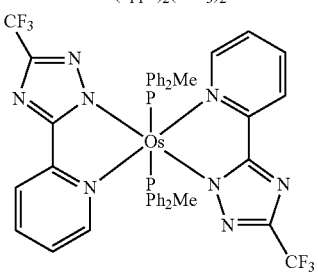

Os(fptz)$_2$(PPh$_2$Me)$_2$

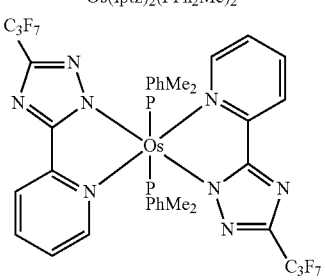

Os(hptz)$_2$(PPhMe$_2$)$_2$

When the EML includes a host and a dopant, an amount of the dopant may be in a range of about 0.01 to about 15 parts by weight based on 100 parts by weight of the host.

A thickness of the EML may be in a range of about 100 Å to about 1,000 Å, for example, about 200 Å to about 600 Å. Maintaining the thickness of the EML within the above ranges may help provide the EML with satisfactory light-emitting capabilities without a substantial increase in driving voltage.

Then, an ETL may be formed on the EML by various methods, such as vacuum deposition, spin coating, and casting. When the ETL is formed by vacuum deposition or spin coating, the deposition and coating conditions may be similar to those for the formation of the HIL, although the deposition and coating conditions may vary depending on the compound that is used to form the ETL.

A material that may stably transport electrons that may be injected from an electron injection electrode (i.e., a cathode) may be used as an ETL-forming material.

Exemplary materials that may be used to form an ETL include a quinoline derivative such as tris(8-quinolinorate) aluminum (Alq$_3$), TAZ, Balq, beryllium bis(benzoquinolin-10-olate (Bebq$_2$), ADN, Compound 201, and Compound 202:

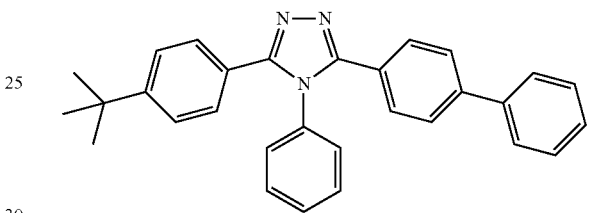

TAZ

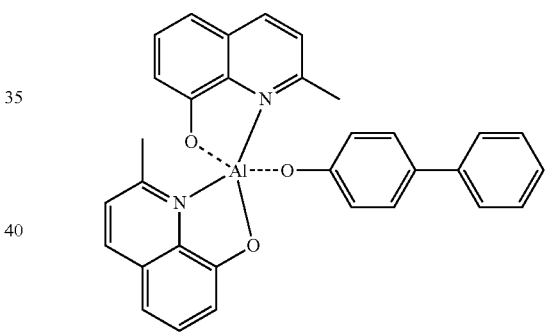

BAlq

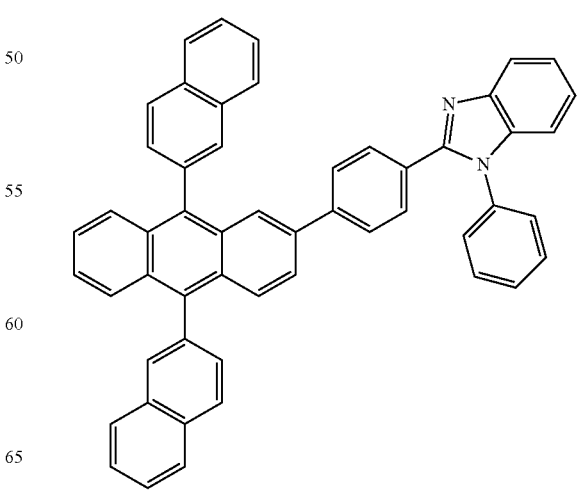

<Compound 201>

-continued

<Compound 202>

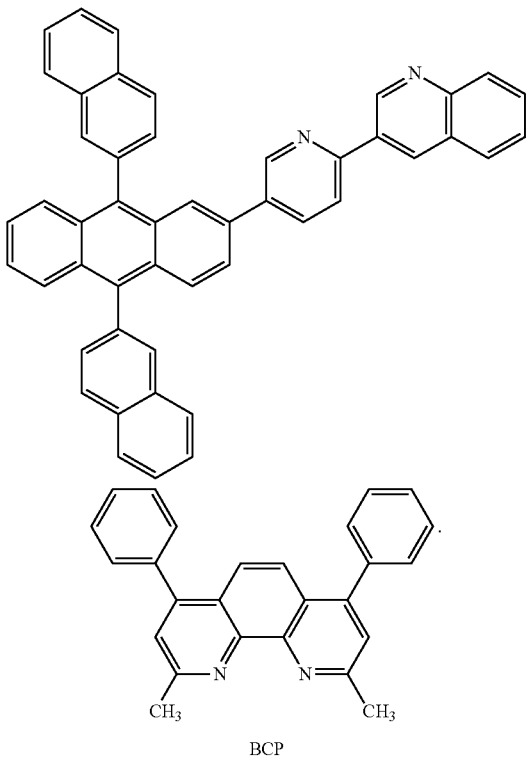

A thickness of the ETL may be in a range of about 100 Å to about 1,000 Å, for example, about 150 Å to about 500 Å. Maintaining the thickness of the ETL within the above ranges may help provide the ETL with satisfactory electron transporting capabilities without a substantial increase in driving voltage.

In some embodiments, the ETL may further include a metal-containing material, in addition to an organic compound for the ETL.

The metal-containing material may include a lithium (Li) complex. Exemplary Li complexes include lithium quinolate (LiQ) and Compound 203 below:

<Compound 203>

Then, an EIL, which facilitates injection of electrons from the cathode, may be formed on the ETL. Any suitable electron-injecting material may be used to form the EIL.

Examples of materials that may be used to form the EIL include LiF, NaCl, CsF, $Li_2O$, and BaO. Deposition conditions of the EIL may be similar to those for the formation of the HIL, although the conditions may vary depending on the compound that is used to form the EIL.

A thickness of the EIL may be in a range of about 1 Å to about 100 Å, for example, about 3 Å to about 90 Å. Maintaining the thickness of the EIL within the above ranges may help provide the EIL with satisfactory electron injection capabilities without a substantial increase in driving voltage.

A second electrode is disposed on the organic layer. When the second electrode is a cathode that may be an electron injection electrode, materials having a low work function, such as a metal, an alloy, and an electro-conductive compound, and a mixture thereof may be used as the second electrode-forming material. The second electrode may be formed as a thin film type transmission electrode using lithium (Li), magnesium (Mg), aluminum (Al), aluminum-lithium (Al—Li), calcium (Ca), magnesium-indium (Mg—In), magnesium-silver (Mg—Ag). In some other embodiments, to manufacture a top-emission light-emitting diode, the transmission electrode may be formed of indium tin oxide (ITO) or indium zinc oxide (IZO).

The OLED has been described with respect to the FIGURE. Additional embodiments include omission of one or more of the layers illustrated in the FIGURE (i.e., EIL, ETL, EML, HTL, and HIL), rearrangement of one or more of the layers illustrated in the FIGURE, and/or additional layers.

When a phosphorescent dopant is used in the EML, a HBL may be formed between the ETL and the EML or between the E-functional layer and the EML by vacuum deposition, spin coating, casting, or LB deposition, in order to prevent diffusion of triplet excitons or holes into the ETL. When the HBL is formed by vacuum deposition or spin coating, the conditions for deposition and coating may be similar to those for the formation of the HIL, although the conditions for deposition and coating may vary according to the material that is used to form the HBL. Exemplary hole-blocking materials include oxadiazole derivatives, triazole derivatives, and phenanthroline derivatives. For example, BCP below may be used to form the HBL.

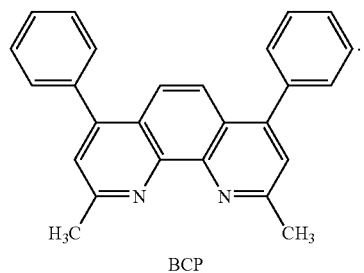

BCP

A thickness of the HBL may be in a range of about 20 Å to about 1,000 Å, for example, about 30 Å to about 300 Å. Maintaining the thickness of the HBL within the above ranges may help provide the HBL with satisfactory hole blocking capabilities without a substantial increase in driving voltage.

The OLED according to another embodiment, may be provided in various types of flat panel display devices such as passive matrix OLED devices and active matrix OLED devices. For example, when the OLED is provided in an active matrix OLED, the first electrode acting as a pixel electrode on the substrate may be electrically connected to a source electrode or a drain electrode of a thin-film transistor (TFT). In addition, the OLED may be provided in a flat panel display device having double-sided screens.

Alternatively, the organic layer of the OLED according to another embodiment, may be formed by vacuum deposition using above-described compounds, or by a wet process that coats the above-described compounds present in a liquid state.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLE

Synthesis Example 1

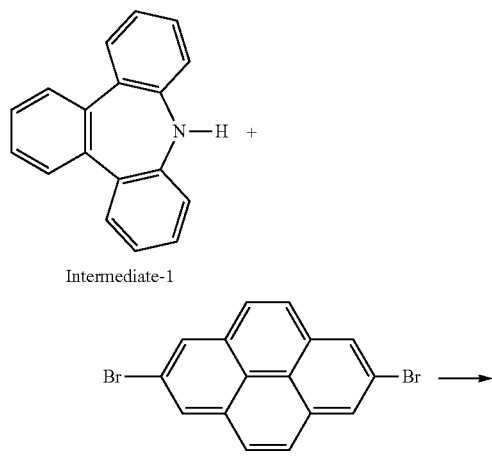

Compound 1

1.7 g (7.2 mmol) of Intermediate-1, 1.3 g (3.6 mmol) of 2,7-dibromopyrene, 40 mg (0.18 mol) of palladium (II) acetate (Pd(OAc)$_2$), 108 mg (0.54 mmol) of P(t-Bu)$_3$, and 1 g (10.9 mmol) of sodium t-butoxide were dissolved in 100 ml of toluene under a nitrogen atmosphere, and the mixture solution was refluxed for 24 hours. After completion of the reaction, the solvent was removed by evaporation, and 1,000 ml of methylene chloride and 1,000 ml of water were added thereto to collect an organic layer. The organic layer was dried by magnesium sulfate, and residues obtained therefrom were separation-purified by silicagel column chromatography to obtain 0.98 g (Yield 40%) of Compound 1 (MS (MALDI-TOF) m/z: 684 [M]+).

Synthesis Example 2

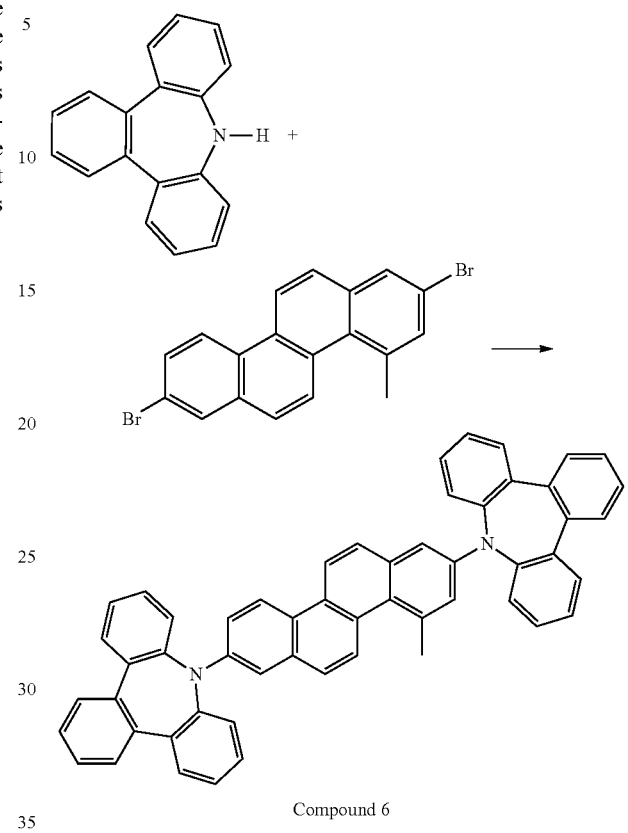

Compound 6

1.2 g (Yield: 41%) of Compound 6 was synthesized in the same manner as in Synthesis Example 1, except that 2,8-dibromo-4-methylchrysene was used instead of 2,7-dibromopyrene (MS (MALDI-TOF) m/z: 724 [M]+).

Synthesis Example 3

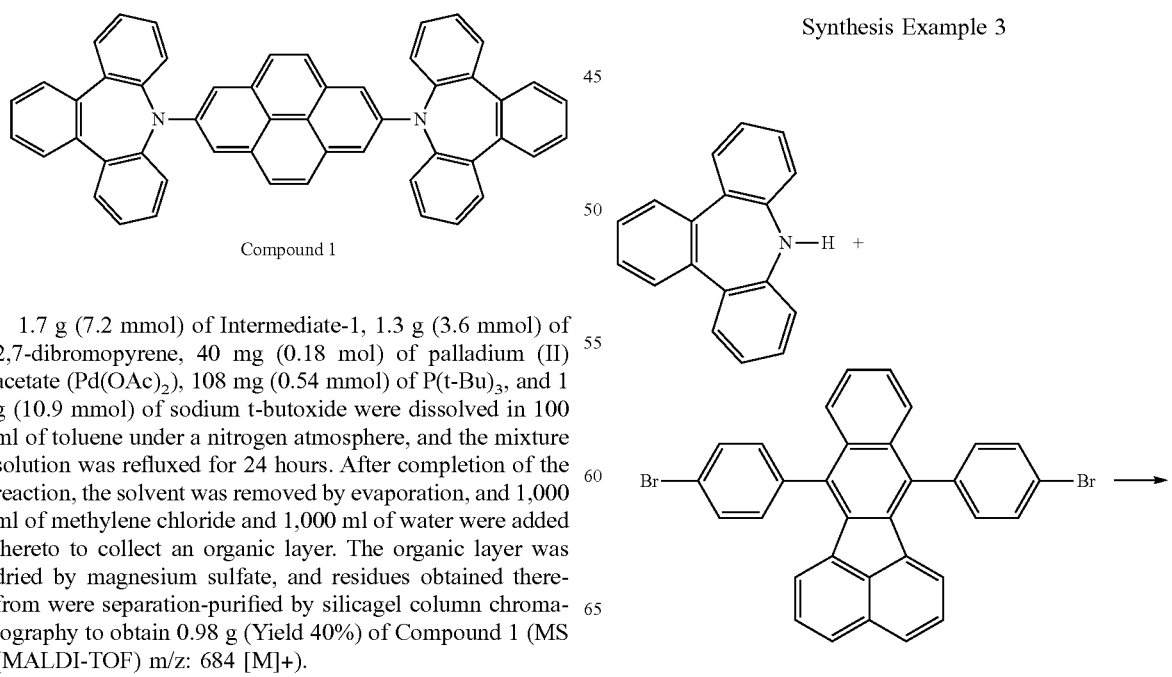

-continued

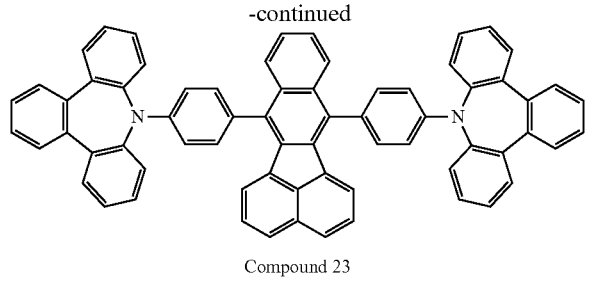

Compound 23

1.2 g (Yield: 41%) of Compound 23 was synthesized in the same manner as in Synthesis Example 1, except that 7,12-bis(4-bromophenyl)benzo[k]fluoranthene was used instead of 2,7-dibromopyrene (MS (MALDI-TOF) m/z: 886 [M]+).

Other additional compounds were synthesized by using the above-described synthesis pathways using suitable intermediate materials.

Synthesis pathways of other compounds other than the above-described compounds may be also easily recognized by one of skill in the art based on the above-described synthesis pathways and the above-described raw materials.

Example 1

An anode was prepared by cutting an ITO glass substrate into a size of 50 mm×50 mm×0.5 mm, followed by ultrasonic cleaning for 15 minutes each time by using acetone isopropyl alcohol and pure water. After that, the ITO glass substrate was subject to UV irradiation for 30 minutes and exposure to ozone for cleaning. Next, m-MTDATA was deposited on top of the ITO glass substrate at a deposition rate of 1 Å/sec to form an HIL having a thickness of 600 Å. Then, α-NPD was deposited on the HIL at a deposition rate of 1 Å/sec to form an HTL having a thickness of 300 Å. Compound 1 and AND were then deposited on the HTL at a deposition rate of 0.05 Å/sec and 1 Å/sec, respectively, to form an EML having a thickness of 200 Å. After that, $Alq_3$ compound was deposited on the EML to form an ETL having a thickness of 300 Å. Then, Lif as an EIL and Al as a cathode were sequentially deposited on the ETL to a thickness of 10 Å and 2,000 Å, respectively, thereby completing a manufacture of an OLED.

Example 2

An OLED having a structure of ITO/m-MTDATA (having a thickness of 600 Å)/α-NPD (having a thickness of 300 Å)/5% Compound 6+ADN (having a thickness of 200 Å)/$Alq_3$ (having a thickness of 300 Å)/LiF (having a thickness of 10 Å)/Al (having a thickness of 2,000 Å) was manufactured in the same manner as in Example 1, except that Compound 6 was used instead of Compound 1 as a dopant.

Example 3

An OLED having a structure of ITO/m-MTDATA (having a thickness of 600 Å)/α-NPD (having a thickness of 300 Å)/5% Compound 23+ADN (having a thickness of 200 Å)/$Alq_3$ (having a thickness of 300 Å)/LiF (having a thickness of 10 Å)/Al (having a thickness of 2,000 Å) was manufactured in the same manner as in Example 1, except that Compound 23 was used instead of Compound 1 as a dopant.

Comparative Example 1

An OLED having a structure of ITO/m-MTDATA (having a thickness of 600 Å)/α-NPD (having a thickness of 300 Å)/5% Compound A+ADN (having a thickness of 200 Å)/$Alq_3$ (having a thickness of 300 Å)/LiF (having a thickness of 10 Å)/Al (having a thickness of 2,000 Å) was manufactured in the same manner as in Example 1, except that Compound A below was used instead of Compound 1 as a dopant.

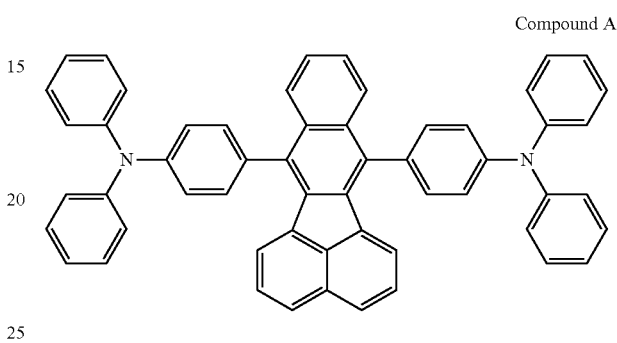

Compound A

Comparative Example 2

An OLED having a structure of ITO/m-MTDATA (having a thickness of 600 Å)/α-NPD (having a thickness of 300 Å)/5% Compound B+ADN (having a thickness of 200 Å)/$Alq_3$ (having a thickness of 300 Å)/LiF (having a thickness of 10 Å)/Al (having a thickness of 2,000 Å) was manufactured in the same manner as in Example 1, except that Compound B below was used instead of Compound 1 as a dopant.

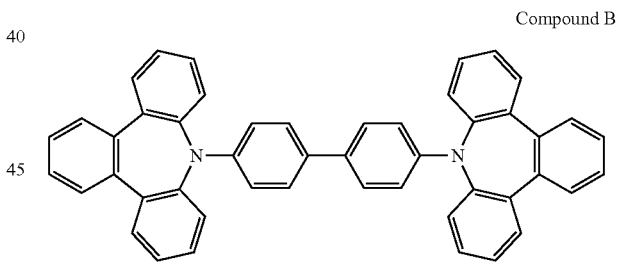

Compound B

The brightness, current density, driving voltage, and color coordinate of each OLED from Examples 1 to 3 and Comparative Examples 1 and 2 were evaluated, and the results thereof are shown in Table 1 below.

TABLE 1

|  | Brightness (cd/m$^2$) | Current density (mA/cm$^2$) | Driving voltage (V) | Color coordinate CIE |
|---|---|---|---|---|
| Example 1 | 700 | 13 | 4.4 | (0.14, 0.077) |
| Example 2 | 700 | 14 | 4.3 | (0.14, 0.079) |
| Example 3 | 700 | 18 | 4.5 | (0.14, 0.073) |
| Comparative Example 1 | 700 | 25 | 4.9 | (0.14, 0.19) |
| Comparative Example 2 | 700 | 50 | 11 | (0.15, 12) |

As described above, according to the one or more of the above embodiments, an organic light-emitting diode including a compound represented by Formula 1 may have excellent optical and electrical performance. The compound used herein may have high blue color purity, and a display using the compound may have a great color reproduction range. For example, an organic light-emitting diode including the compound may provide a sRGB color reproduction range, i.e., a standard color reproduction range, of an OLED TV.

By way of summation and review, an OLED may have a structure including a substrate, an anode formed on the substrate, and a hole transport layer (HTL), an emission layer (EML), an electron transport layer (ETL), and a cathode that are sequentially stacked on the anode. The HTL, the EML, and the ETL are organic thin films formed using organic compounds.

When a voltage is applied between the anode and the cathode, holes injected from the anode pass via the HTL and migrate toward the EML, and electrons injected from the cathode pass via the ETL and migrate toward the EML. The holes and the electrons are recombined with each other in the EML to generate excitons. Then, the excitons are transitioned from an excited state to a ground state, thereby generating light.

According to an embodiment, provided is a material that may have excellent electrical stability, high charge-transport ability or light-emitting ability, high glass transition temperature, and the ability to prevent crystallization, for example, in comparison with organic monomolecular materials.

One or more embodiments include a material that may have excellent electrical stability and blue light-emitting ability of high color purity, and an organic light-emitting diode (OLED) including the material and that may have high efficiency, low driving voltage, high brightness, and long lifespan.

Materials that may have been used as a host, may have structures that may not be suitable for use as a blue dopant. Materials that may have been used to form an HTL, may have short wavelengths and may not be suitable for use as a blue dopant. For example, a benzoazepine compound may have short wavelengths, and may not be suitable for use as a blue dopant. While an emission layer may include a host and a dopant, and energy may be efficiently transferred from a host to a dopant, some compounds may have a bigger energy gap than materials that may be used to form a blue dopant, such that energy transfer may be impaired, and device efficiency may be low.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A heterocyclic compound represented by Formula 1:

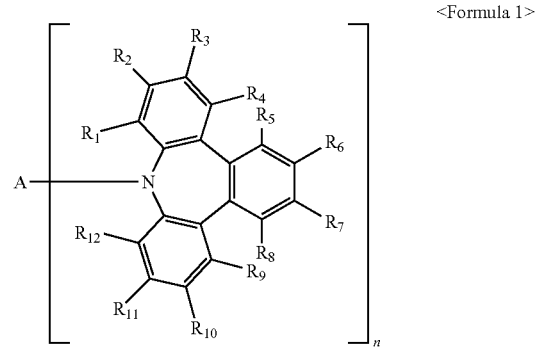

<Formula 1> wherein:

$R_1$ to $R_{12}$ are each independently a hydrogen atom, a deuterium atom, a halogen group, a nitro group, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{60}$ cycloalkyl group, a substituted or unsubstituted $C_3$-$C_{60}$ cycloalkenyl group, a substituted or unsubstituted $C_5$-$C_{60}$ cycloalkynyl group, a substituted or unsubstituted $C_6$-$C_{60}$ aryl group, a substituted or unsubstituted $C_2$-$C_{60}$ heteroaryl group, a substituted or unsubstituted $C_6$-$C_{60}$ arylamino group, or —$SiR_{51}R_{52}R_{53}$;

$R_{51}$ to $R_{53}$ are each independently a hydrogen atom, a deuterium atom, a substituted or unsubstituted $C_1$-$C_{60}$ alkyl group, or a substituted or unsubstituted $C_6$-$C_{60}$ aryl group;

A is a group represented by one of the following Formula 2c to 2j; and n is an integer of 1 to 3,

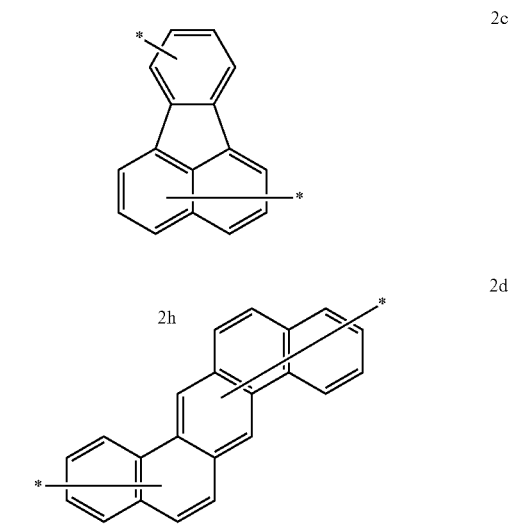

73
-continued

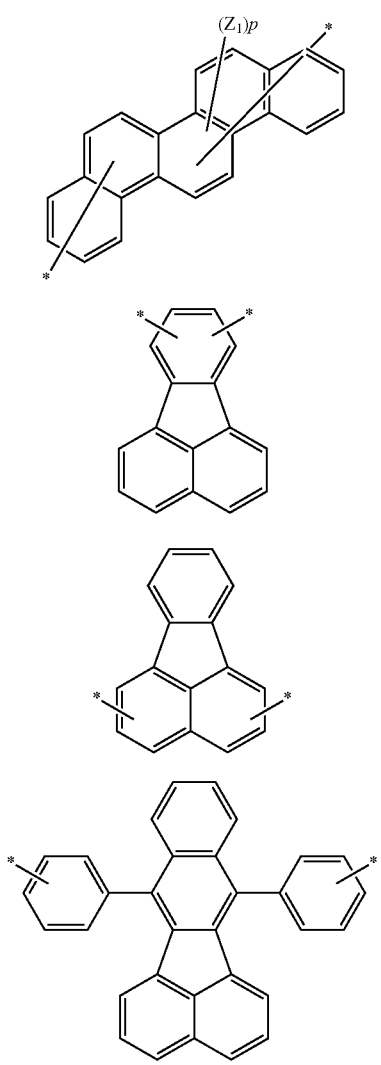

2e

2f

2g

2h

74
-continued

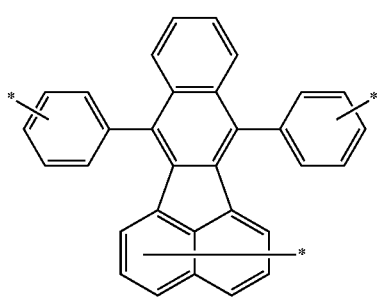

2i

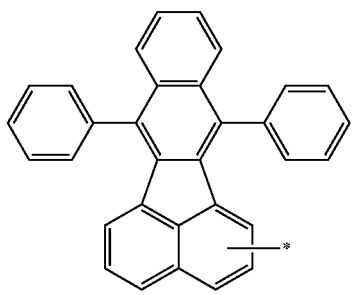

2j wherein, in Formulae 2c to 2j:

Z$_1$ is a hydrogen atom, a deuterium atom, a substituted or unsubstituted C$_1$-C$_{20}$ alkyl group, a substituted or unsubstituted C$_6$-C$_{20}$ aryl group, a substituted or unsubstituted C$_2$-C$_{20}$ heteroaryl group, a substituted or unsubstituted C$_6$-C$_{20}$ condensed polycyclic group, a halogen group, a cyano group, a nitro group, a hydroxyl group, or a carboxyl group, wherein Z$_1$ is identical to or different from each other when there is a plurality of Z$_1$s;

p is an integer of 1 to 4; and

* indicates a binding site to N.

2. The heterocyclic compound as claimed in claim 1, wherein the heterocyclic compound is represented by Formula 4:

<Formula 4>

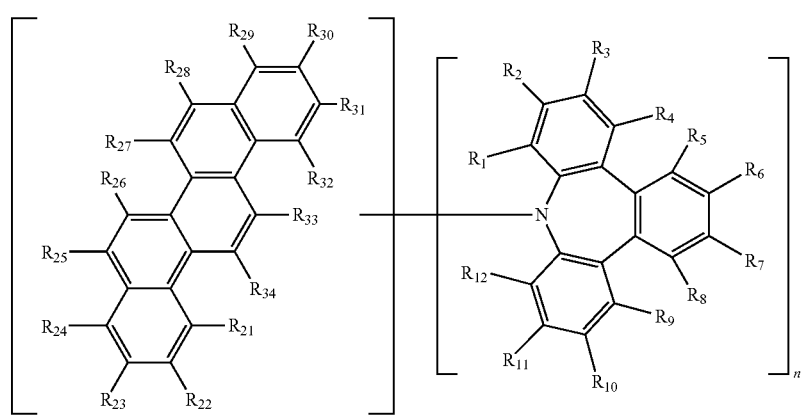

wherein:

$R_1$ to $R_{12}$ are as defined in claim 1;

$R_{21}$ to $R_{34}$ are each independently a binding site to N, a hydrogen atom, a deuterium atom, a substituted or unsubstituted $C_1$-$C_{60}$ alkyl group, a substituted or unsubstituted $C_6$-$C_{60}$ aryl group, a substituted or unsubstituted $C_2$-$C_{60}$ heteroaryl group, or —$SiR_{51}R_{52}R_{53}$;

$R_{51}$ to $R_{53}$ are each independently a hydrogen atom, a deuterium atom, a substituted or unsubstituted $C_1$-$C_{60}$ alkyl group, or a substituted or unsubstituted $C_6$-$C_{60}$ aryl group; and n is an integer of 1 to 3.

3. The heterocyclic compound as claimed in claim 1, wherein the heterocyclic compound is represented by Formula 5:

<Formula 5>

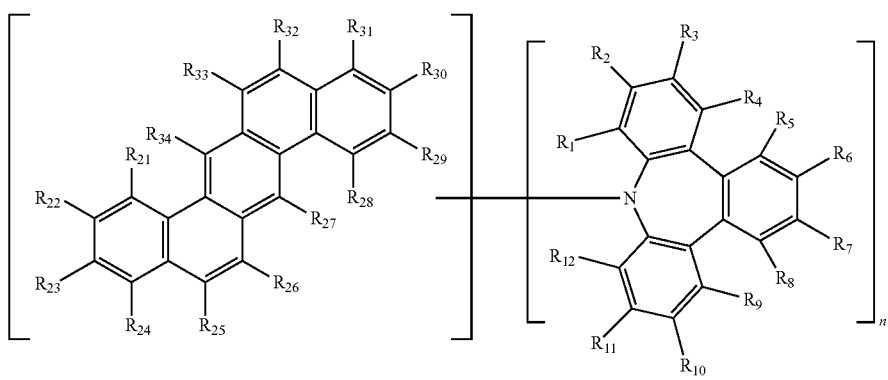

wherein:

$R_1$ to $R_{12}$ are as defined in claim 1;

$R_{21}$ to $R_{34}$ are each independently a binding site to N, a hydrogen atom, a deuterium atom, a substituted or unsubstituted $C_1$-$C_{60}$ alkyl group, a substituted or unsubstituted $C_6$-$C_{60}$ aryl group, a substituted or unsubstituted $C_2$-$C_{60}$ heteroaryl group, or —$SiR_{51}R_{52}R_{53}$;

$R_{51}$ to $R_{53}$ are each independently a hydrogen atom, a deuterium atom, a substituted or unsubstituted $C_1$-$C_{60}$ alkyl group, or a substituted or unsubstituted $C_6$-$C_{60}$ aryl group; and n is an integer of 1 to 3.

4. The heterocyclic compound as claimed in claim 1, wherein the heterocyclic compound is represented by Formula 6:

<Formula 6>

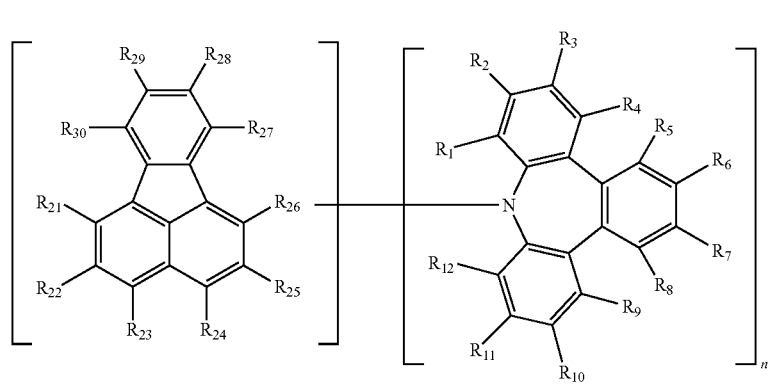

wherein:

$R_1$ to $R_{12}$ are as defined in claim 1;

$R_{21}$ to $R_{30}$ are each independently a binding site to N, a hydrogen atom, a deuterium atom, a substituted or unsubstituted $C_1$-$C_{60}$ alkyl group, a substituted or unsubstituted $C_6$-$C_{60}$ aryl group, a substituted or unsubstituted $C_2$-$C_{60}$ heteroaryl group, or —$SiR_{51}R_{52}R_{53}$;

$R_{51}$ to $R_{53}$ are each independently a hydrogen atom, a deuterium atom, a substituted or unsubstituted $C_1$-$C_{60}$ alkyl group, or a substituted or unsubstituted $C_6$-$C_{60}$ aryl group;

n is an integer of 1 to 3.

5. The heterocyclic compound as claimed in claim 1, wherein the heterocyclic compound is represented by Formula 7:

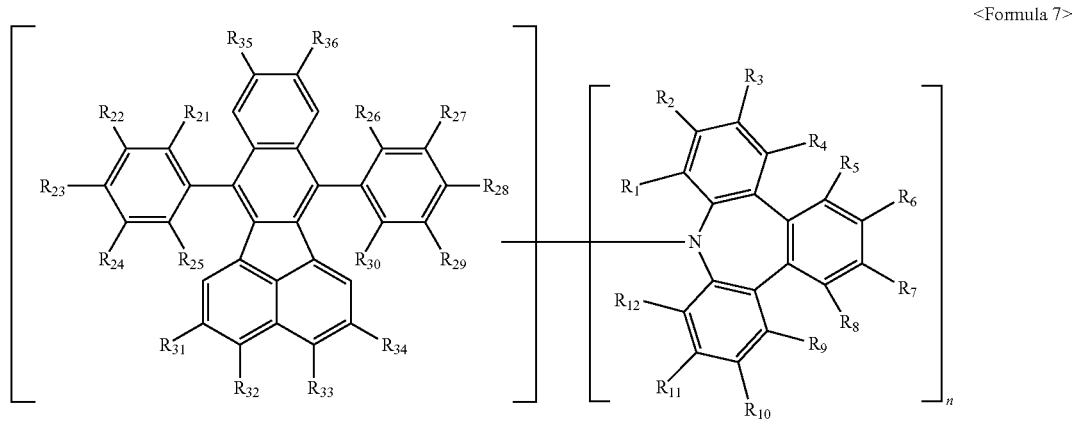

<Formula 7> wherein:

$R_1$ to $R_{12}$ are as defined in claim 1;

$R_{21}$ to $R_{36}$ are each independently a binding site to N, a hydrogen atom, a deuterium atom, a substituted or unsubstituted $C_1$-$C_{60}$ alkyl group, a substituted or unsubstituted $C_6$-$C_{60}$ aryl group, a substituted or unsubstituted $C_2$-$C_{60}$ heteroaryl group, or —$SiR_{51}R_{52}R_{53}$;

$R_{51}$ to $R_{53}$ are each independently a hydrogen atom, a deuterium atom, a substituted or unsubstituted $C_1$-$C_{60}$ alkyl group, or a substituted or unsubstituted $C_6$-$C_{60}$ aryl group; and n is an integer of 1 to 3.

6. The heterocyclic compound as claimed in claim 1, wherein the heterocyclic compound represented by Formula 1 is one of compounds 7 to 23 and 29 to 32:

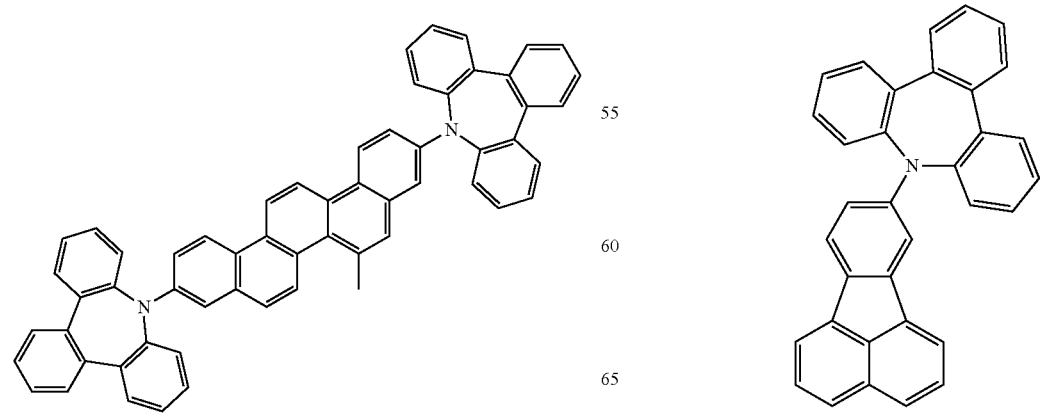

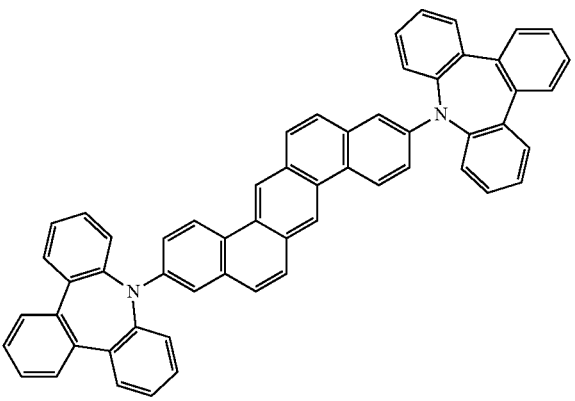

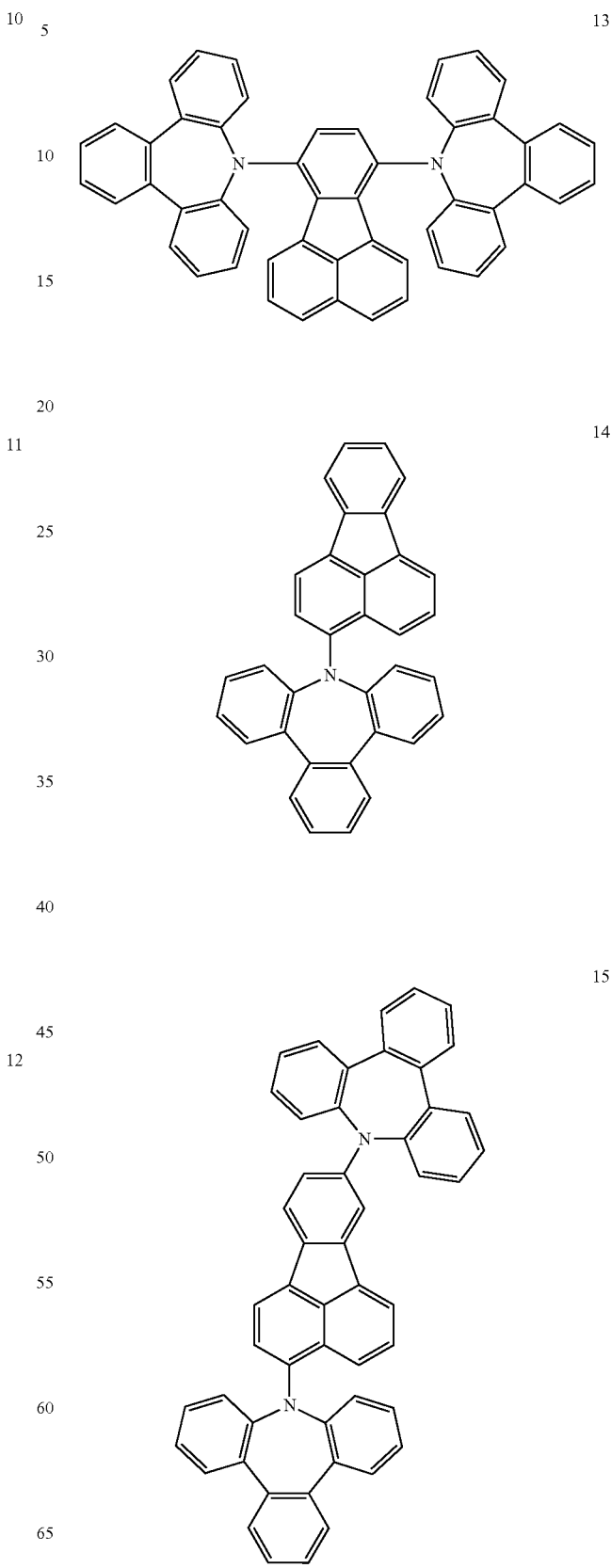

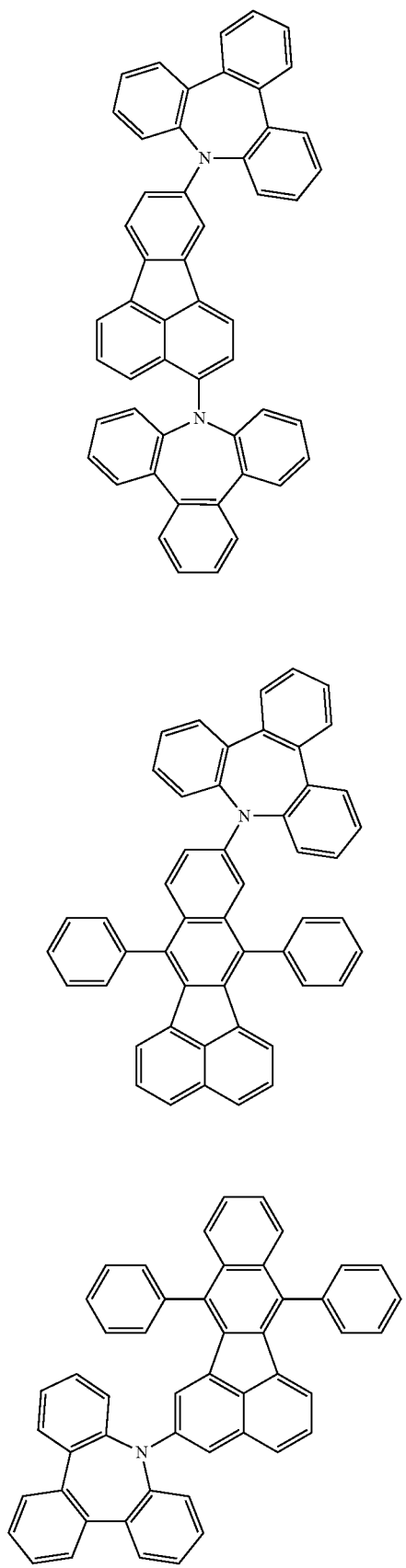
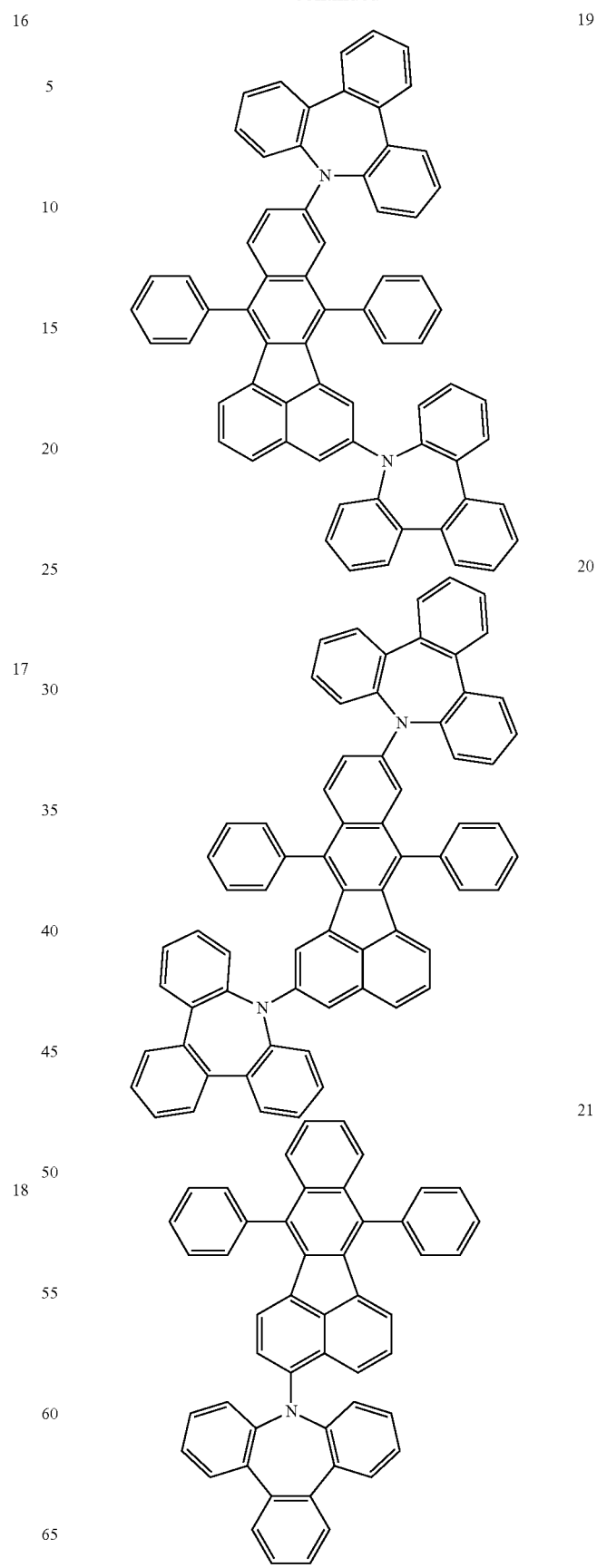

22

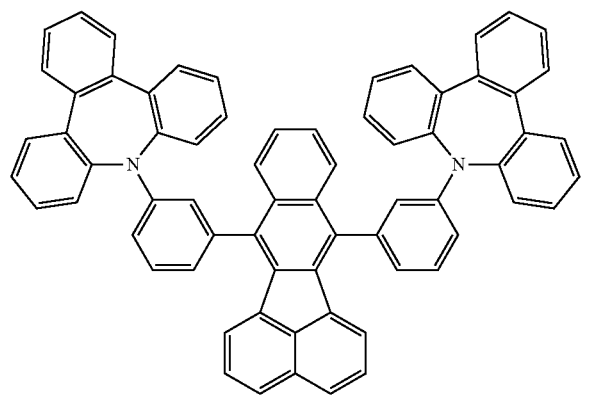

23

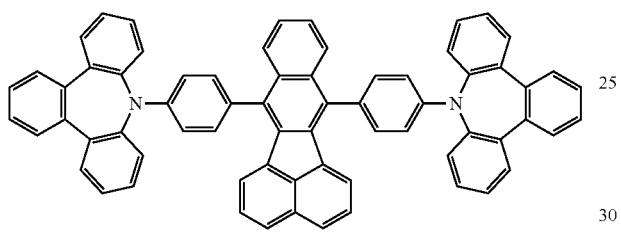

29

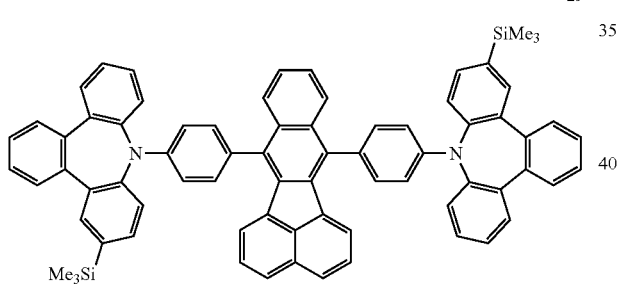

30

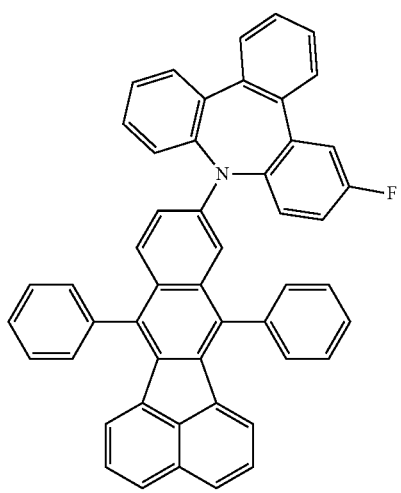

31

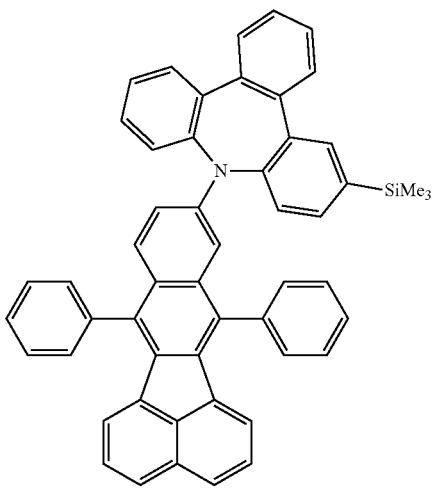

32

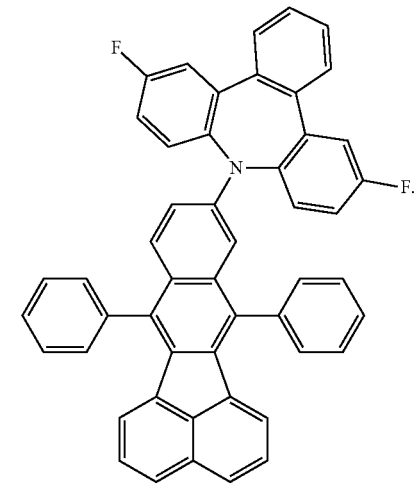

7. An organic light-emitting diode, comprising:
a first electrode;
a second electrode facing the first electrode; and
an organic layer disposed between the first electrode and the second electrode, the organic layer including at least one heterocyclic compound as claimed in claim 1.

8. The organic light-emitting diode as claimed in claim 7, wherein the organic layer is an emission layer.

9. The organic light-emitting diode as claimed in claim 7, wherein the organic layer comprises an emission layer, and, optionally, one or more of an electron injection layer, an electron transport layer, a functional layer having both electron injection and electron transport capabilities, a hole injection layer, a hole transport layer, or a functional layer having both hole injection and hole transport capabilities,
wherein the emission layer includes an anthracene-based compound, an arylamine-based compound, or a styryl-based compound.

10. The organic light-emitting diode as claimed in claim 7, wherein the organic layer comprises an emission layer, and, optionally, one or more of an electron injection layer, an electron transport layer, a functional layer having both electron injection and electron transport capabilities, a hole injection layer, a hole transport layer, or a functional layer having both hole injection and hole transport capabilities, wherein emission layer includes at least one of a red emission layer, a green emission layer, a blue emission layer, or a white emission layer that includes a phosphorescent compound.

11. The organic light-emitting diode as claimed in claim 10, wherein the hole injection layer, the hole transport layer, or the functional layer having both hole injection and hole transport capabilities includes a charge-generating material.

12. The organic light-emitting diode as claimed in claim 11, wherein the charge-generating material is a p-dopant.

13. The organic light-emitting diode as claimed in claim 12, wherein the p-dopant is a quinone derivative, a metal oxide, or a cyano group-containing compound.

14. The organic light-emitting diode as claimed in claim 7, wherein the organic layer includes an electron transport layer that includes a metal complex.

15. The organic light-emitting diode as claimed in claim 14, wherein the metal complex is a lithium (Li) complex.

16. The organic light-emitting diode as claimed in claim 7, wherein the organic layer is formed by a wet process.

17. The organic light-emitting diode as claimed in claim 7, wherein the first electrode is electrically connected to a source electrode or a drain electrode of a thin film transistor.

* * * * *